(12) United States Patent
Furuta et al.

(10) Patent No.: US 10,331,057 B2
(45) Date of Patent: Jun. 25, 2019

(54) LIGHT EMITTING ELEMENT DEVICE INCLUDING LIGHT EMITTING THYRISTOR AND OPTICAL PRINT HEAD INCLUDING THE LIGHT EMITTING ELEMENT DEVICE

(71) Applicant: Oki Data Corporation, Tokyo (JP)

(72) Inventors: Hironori Furuta, Takasaki (JP);
Genichiro Matsuo, Takasaki (JP);
Shinya Jumonji, Gunma (JP)

(73) Assignee: Oki Data Corporation, Tokyo (JP)

( * ) Notice: Subject to any disclaimer, the term of this patent is extended or adjusted under 35 U.S.C. 154(b) by 83 days.

(21) Appl. No.: 15/418,669

(22) Filed: Jan. 27, 2017

(65) Prior Publication Data

US 2017/0219952 A1   Aug. 3, 2017

(30) Foreign Application Priority Data

Jan. 29, 2016   (JP) .................. 2016-015948

(51) Int. Cl.
*G03G 15/04*       (2006.01)
*H01L 33/62*       (2010.01)
*H01L 33/30*       (2010.01)
*H01L 33/38*       (2010.01)
(Continued)

(52) U.S. Cl.
CPC . *G03G 15/04036* (2013.01); *G03G 15/04054* (2013.01); *H01L 25/0753* (2013.01); *H01L 33/0041* (2013.01); *H01L 33/30* (2013.01); *H01L 33/38* (2013.01); *H01L 33/62* (2013.01)

(58) Field of Classification Search
CPC ........ G03G 15/04036; G03G 15/04054; H01L 33/0041; H01L 33/30; H01L 33/38; H01L 33/62; H01L 25/0753
See application file for complete search history.

(56) References Cited

U.S. PATENT DOCUMENTS 6,735,230 B1 * 5/2004 Tanabe .................. B82Y 20/00
372/43.01
2009/0242904 A1 * 10/2009 Nakai ................. H01L 33/0041
257/88

(Continued)

FOREIGN PATENT DOCUMENTS

JP   2007-165535 A   6/2007
JP   2009-260246 A   11/2009

(Continued)

*Primary Examiner* — Roy Y Yi
(74) *Attorney, Agent, or Firm* — Rabin & Berdo, P.C.

(57) ABSTRACT

A light emitting element device includes: a light emitting thyristor having a layered structure including a first semiconductor layer of a first conductivity type, a second semiconductor layer of a second conductivity type different from the first conductivity type, a third semiconductor layer of the first conductivity type, and a fourth semiconductor layer of the second conductivity type that are layered in this order; and a gate electrode for supplying gate current to the light emitting thyristor. The light emitting thyristor includes an etching stop layer disposed on a surface of the third semiconductor layer or included in the third semiconductor layer, the etching stop layer being a semiconductor layer having an etching rate lower than an etching rate of a semiconductor layer adjacent to the etching stop layer.

15 Claims, 13 Drawing Sheets

(51) Int. Cl.
*H01L 25/075* (2006.01)
*H01L 33/00* (2010.01)

(56) References Cited

U.S. PATENT DOCUMENTS

2011/0050838 A1* 3/2011 Nagumo .................... B41J 2/45
　　　　　　　　　　　　　　　　　　　　　347/224
2016/0035786 A1* 2/2016 Matsumura ......... H01L 27/1464
　　　　　　　　　　　　　　　　　　　　　438/59

FOREIGN PATENT DOCUMENTS

JP　　　2012-015394 A　　1/2012
JP　　　2015-109417 A　　6/2015

* cited by examiner

LIGHT EMITTING ELEMENT DEVICE INCLUDING LIGHT EMITTING THYRISTOR AND OPTICAL PRINT HEAD INCLUDING THE LIGHT EMITTING ELEMENT DEVICE

BACKGROUND OF THE INVENTION

1. Field of the Invention

The present invention relates to a light emitting element device including a light emitting thyristor, and an optical print head including light emitting element devices.

2. Description of the Related Art

Optical print heads including a light emitting thyristor array (or light emitting element array) including multiple light emitting thyristors (or light emitting elements) are proposed as optical print heads (or exposure devices) of electrophotographic image forming apparatuses (see, for example, Japanese Patent Application Publication No. 2015-109417, in particular, FIG. 4 and paragraphs 0036 to 0060). Japanese Patent Application Publication No. 2015-109417 discloses a light emitting thyristor having an npnp layered structure in which a p-type anode layer (or first semiconductor layer), an n-type gate layer (or second semiconductor layer), a p-type gate layer (or third semiconductor layer), and an n-type cathode layer (or fourth semiconductor layer) are layered, a gate electrode being formed on the p-type gate layer (or third semiconductor layer). The n-type gate layer (or second semiconductor layer) has a band gap smaller than that of each of the p-type anode layer (or first semiconductor layer) and n-type cathode layer (or fourth semiconductor layer), and the p-type gate layer (or third semiconductor layer) has a band gap smaller than that of the n-type gate layer (or second semiconductor layer), so that the p-type gate layer (or third semiconductor layer) is a light emitting layer.

In the above layered structure, the surface on which the gate electrode is disposed is formed by wet etching the p-type gate layer. Thus, the p-type gate layer needs to have a sufficiently large thickness (or a thickness including an etching margin) in consideration of variation in etching rate of the wet etching. However, increase in thickness of the p-type gate layer, which is a light emitting layer, increases light absorption by the p-type gate layer itself, thus reducing light extraction efficiency. Further, increase in thickness of the p-type gate layer, which is a base layer of the upper npn structure (or npn transistor) of the light emitting thyristor, reduces the current gain of the npn transistor, thus deteriorating the switching characteristics of the light emitting thyristor.

SUMMARY OF THE INVENTION

An aspect of the present invention is intended to provide a light emitting element device having high light extraction efficiency and good switching characteristics, and an optical print head including such a light emitting element device.

According to an aspect of the present invention, there is provided a light emitting element device including: a light emitting thyristor having a layered structure including a first semiconductor layer of a first conductivity type, a second semiconductor layer of a second conductivity type different from the first conductivity type, a third semiconductor layer of the first conductivity type, and a fourth semiconductor layer of the second conductivity type that are layered in this order; and a gate electrode for supplying gate current to the light emitting thyristor, wherein the light emitting thyristor includes an etching stop layer disposed on a surface of the third semiconductor layer or included in the third semiconductor layer, the etching stop layer being a semiconductor layer having an etching rate lower than an etching rate of a semiconductor layer adjacent to the etching stop layer.

According to another aspect of the present invention, there is provided an optical print head including: a light emitting element array including a plurality of light emitting element portions; and a lens array that focuses light emitted from the light emitting element array, wherein each of the plurality of light emitting element portions is the above light emitting element device.

DETAILED DESCRIPTION OF THE INVENTION

Embodiments of the present invention will now be described with reference to the attached drawings.

<1> First Embodiment

<1-1> Light Emitting Element Array

Figure 1:
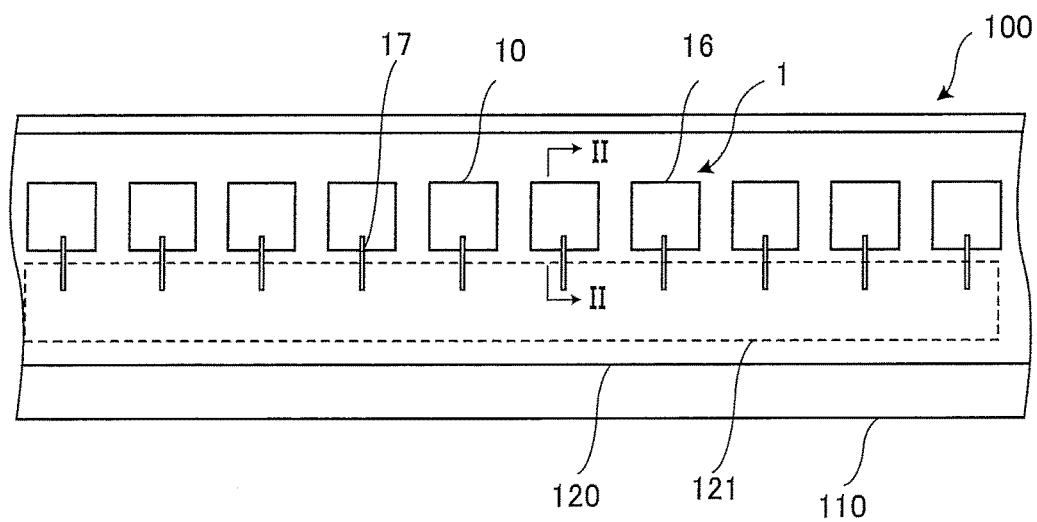
FIG. 1 is a plan view schematically illustrating a configuration of a light emitting element array including light emitting element devices according to a first embodiment of the present invention.

FIG. 1 is a plan view schematically illustrating a configuration of a light emitting element array (or light emitting thyristor array) 100 including multiple light emitting element devices (or light emitting element portions) 1 according to a first embodiment of the present invention. The light emitting element array 100 is mounted on an optical print head as an exposure device in an electrophotographic image forming apparatus. As illustrated in FIG. 1, the light emitting element array 100 includes, for example, a chip-on-board (COB) substrate 110, a semiconductor substrate 120 as a substrate mounted on the COB substrate 110, and multiple light emitting thyristors 16 as multiple light emitting elements mounted on the semiconductor substrate 120. The semiconductor substrate 120 and the multiple light emitting thyristors 16 as the multiple light emitting elements form a light emitting element array chip (or light emitting thyristor array chip). A light emitting thyristor array head as the optical print head will be described in a ninth embodiment described later.

The semiconductor substrate 120 is, for example, a silicon (Si) substrate, and includes a drive circuit 121 that is an integrated circuit that drives the light emitting thyristors 16. The drive circuit 121 may be provided on the semiconductor substrate 120 or COB substrate 110 as an integrated circuit chip.

The light emitting element devices 1 are formed by bonding or attaching light emitting thyristor portions (which may also be referred to as light emitting element devices) 10 including the light emitting thyristors 16 onto the semiconductor substrate 120. The light emitting thyristor portions 10 including the light emitting thyristors 16 are each formed on a production substrate (e.g., a production substrate 150 in FIG. 3A described later), for example. The light emitting thyristor portions 10 (e.g., epitaxial films as thin films having a semiconductor layered structure formed by epitaxial growth) are each separated or peeled off from the production substrate and then bonded onto a major surface of the semiconductor substrate 120.

The light emitting element array 100 also includes wirings 17 that electrically connect the light emitting element devices 1 to the drive circuit 121. The wirings 17 are wiring layers or wires formed of conductive material. When the wirings 17 are formed by forming wiring layers on surfaces of the light emitting element devices 1, before the wiring layers are formed, insulation layers are formed on regions of the light emitting thyristor portions 10 outside electrodes of the light emitting thyristor portions 10 and regions of the semiconductor substrate 120 outside electrodes on the semiconductor substrate 120. The configuration of FIG. 1 is merely an example, and the configuration of the light emitting element array is not limited to that illustrated in FIG. 1.

<1-2> Light Emitting Element Device

Figure 2:
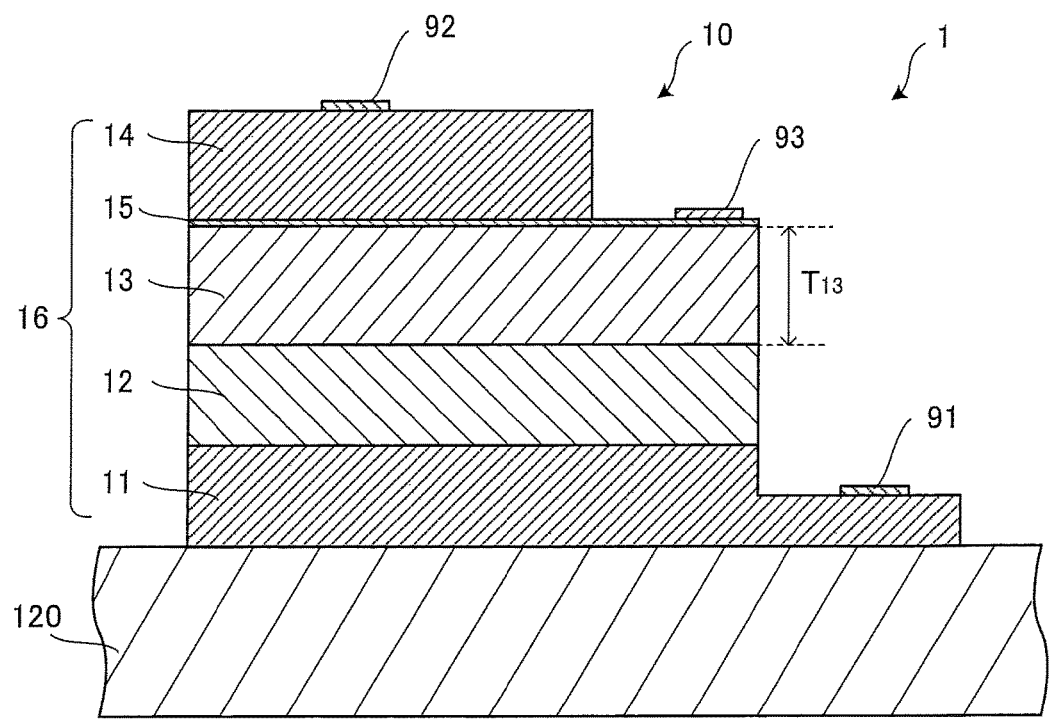
FIG. 2 is a sectional view schematically illustrating a configuration of one of the light emitting element devices according to the first embodiment (or a cross-section taken along line II-II in FIG. 1)

FIG. 2 is a sectional view schematically illustrating a configuration of one of the light emitting element devices 1 according to the first embodiment (or a cross-section taken along line II-II in FIG. 1). As illustrated in FIGS. 1 and 2, the light emitting element device 1 according to the first embodiment includes a part of the semiconductor substrate 120 as a substrate, and the light emitting thyristor portion 10 that is provided on the part of the semiconductor substrate 120 and driven by the drive circuit 121.

As illustrated in FIG. 2, the light emitting thyristor 16 has a layered structure (or layered portion) including a p-type anode layer 11 as a first semiconductor layer of a first conductivity type, an n-type gate layer 12 as a second semiconductor layer of a second conductivity type different from the first conductivity type, a p-type gate layer 13 as a third semiconductor layer of the first conductivity type, an etching stop layer 15, and an n-type cathode layer 14 as a fourth semiconductor layer of the second conductivity type that are layered in this order. The etching stop layer 15 is disposed on a surface of the p-type gate layer 13 as the third semiconductor layer on the n-type cathode layer 14 side. The etching stop layer 15 is a semiconductor layer having an etching rate lower than that of the semiconductor layer (in FIG. 2, the n-type cathode layer 14) adjacent to and above the etching stop layer 15. In this example, the etching stop layer 15 has an etching rate lower than that of each of the semiconductor layers (in FIG. 2, the p-type gate layer 13 and n-type cathode layer 14) adjacent to the etching stop layer 15.

In the first embodiment, the p-type anode layer 11 is a p-type aluminum gallium arsenide (AlGaAs) layer; the n-type gate layer 12 is an n-type AlGaAs layer; the p-type gate layer 13 is a p-type AlGaAs layer; the n-type cathode layer 14 is an n-type AlGaAs layer. In these layers, carbon (C) or zinc (Zn) is used as the p-type impurity or dopant, and silicon (Si) is used as the n-type impurity or dopant. The composition ratio of Al in the p-type anode layer (or p-type AlGaAs layer) 11 and the composition ratio of Al in the n-type cathode layer (or n-type AlGaAs layer) 14 are higher than the composition ratio of Al in the n-type gate layer (or n-type AlGaAs layer) 12. Also, the composition ratio of Al in the n-type gate layer (or n-type AlGaAs layer) 12 is higher than the composition ratio of Al in the p-type gate layer (or p-type AlGaAs layer) 13. In these layers, the higher the composition ratio of Al, the greater the band gap.

The etching stop layer 15 is, for example, a p-type indium gallium phosphide (InGaP) layer. The etching stop layer 15 has a thickness less than that of each of the semiconductor layers (in FIG. 2, the p-type gate layer 13 and n-type cathode layer 14) adjacent to the etching stop layer 15. The thickness of the etching stop layer 15 is preferably in the range of about 10 to 50 nm.

As illustrated in FIG. 2, the light emitting element device 1 includes an anode electrode 91 disposed on the p-type anode layer 11, a cathode electrode 92 disposed on the n-type cathode layer 14, and a gate electrode 93 disposed on the etching stop layer 15 and electrically connected to the p-type gate layer 13 via the etching stop layer 15.

In the light emitting element device 1 according to the first embodiment, the drive circuit 121 (FIG. 1) supplies a signal (or gate current) to the gate electrode 93 of the light emitting thyristor 16 to establish an on state between the p-type anode layer 11 and the n-type cathode layer 14, and supplies an anode signal (or cathode signal) to the anode electrode 91 (or cathode electrode 92), thereby causing current to flow between the p-type anode layer 11 and the n-type cathode layer 14 to cause the p-type gate layer 13 of the light emitting thyristor 16 to emit light. The drive circuit 121 also makes the anode signal (or cathode signal) less than or equal to a predetermined level to establish an off state between the p-type anode layer 11 and the n-type cathode layer 14.

<1-3> Manufacturing Process of Light Emitting Element Device

FIGS. 3A to 3F are sectional views schematically illustrating a manufacturing process of the light emitting element device 1 illustrated in FIG. 2. The light emitting thyristor portion 10 of the light emitting element device 1 is produced on the production substrate 150 different from the semiconductor substrate 120 illustrated in FIG. 2.

Figure 3A:
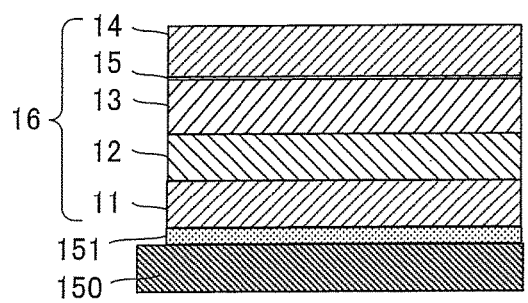
FIGS. 3A to 3F are sectional views schematically illustrating a manufacturing process of the light emitting element device illustrated in FIG. 2.

First, as illustrated in FIG. 3A, the light emitting thyristor 16 having the layered structure consisting of the p-type anode layer (or p-type AlGaAs layer) 11, n-type gate layer (or n-type AlGaAs layer) 12, p-type gate layer (or p-type AlGaAs layer) 13, etching stop layer (or p-type InGaP layer) 15, and n-type cathode layer (or n-type AlGaAs layer) 14 is formed on a p-type AlAs layer (or separation layer) 151 provided on the production substrate 150.

Figure 3D:
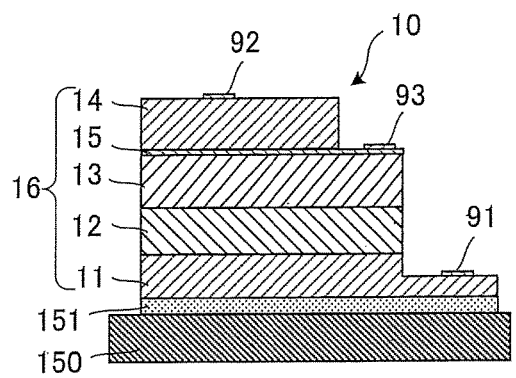
Figure 3B:
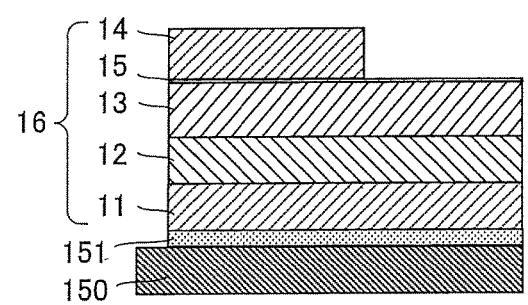

Next, as illustrated in FIG. 3B, the n-type cathode layer 14 is partially etched by wet etching using, for example, a mixture of phosphoric acid, hydrogen peroxide solution, and water, or other etchants. The etching rate of InGaP by the mixture is about one hundredth of the etching rate of AlGaAs by the mixture. Thus, the wet etching in FIG. 3B stops at the etching stop layer 15 formed of InGaP. The upper surface of the etching stop layer 15 formed of InGaP includes a region on which the gate electrode 93 (FIG. 3D) is to be formed.

Figure 3E:
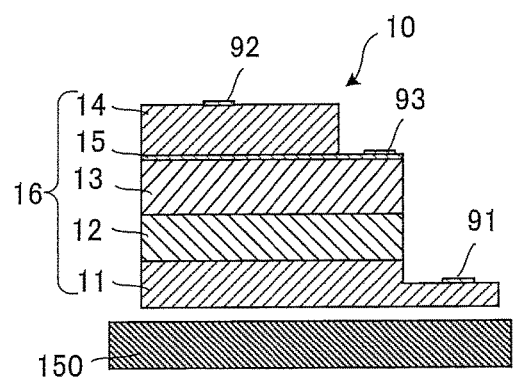
Figure 3C:
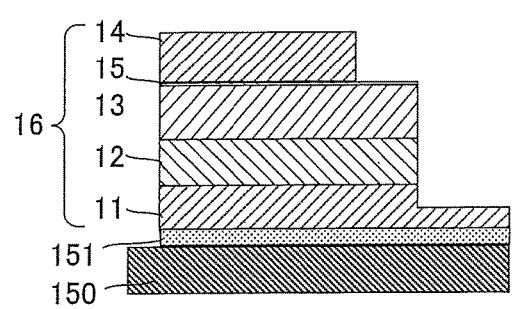

Next, as illustrated in FIG. 3C, the etching stop layer 15 is partially removed by using, for example, hydrochloric acid so that the p-type gate layer 13 is partially exposed; then, by wet etching using a mixture that is the same as the above-described mixture, the p-type gate layer 13 and n-type gate layer 12 are partially removed, and a part of the p-type anode layer 11 is etched, so that a region on which the anode electrode 91 (FIG. 3D) is to be formed is formed.

Next, as illustrated in FIG. 3D, the anode electrode 91 is formed on the p-type anode layer 11, the cathode electrode 92 is formed on the n-type cathode layer 14, and the gate electrode 93 is formed on the etching stop layer 15, so that the light emitting thyristor portion 10 including the light emitting thyristor 16 is formed. The light emitting thyristor 16, which is, for example, an epitaxial film, can be separated from the production substrate 150 by etching the separation layer 151 and can be attached or bonded onto another substrate.

Next, as illustrated in FIG. 3E, the light emitting thyristor portion 10 is separated from the production substrate 150 by, for example, removing (or dissolving) the separation layer 151 while holding (e.g., by attraction or suction) the light emitting thyristor portion 10 by a holding device.

Figure 3F:
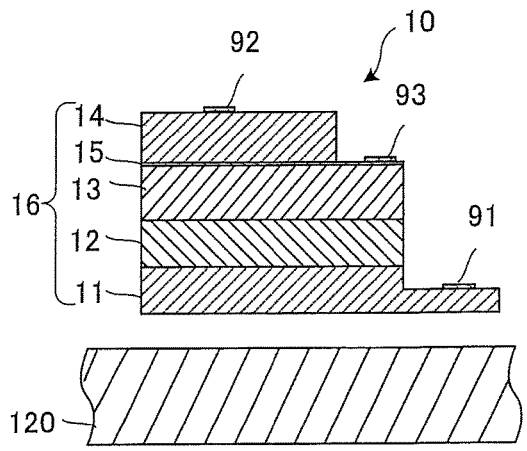

Next, as illustrated in FIG. 3F, the separated light emitting thyristor portion 10 is transferred onto the semiconductor substrate 120 and bonded to a predetermined position on the semiconductor substrate 120. The above process is repeatedly performed, so that the multiple light emitting thyristor portions 10 are formed on the semiconductor substrate 120. After that, for each of the multiple light emitting thyristor portions 10, the anode electrode 91, cathode electrode 92, and gate electrode 93 are electrically connected to electrode portions of the drive circuit 121 by the wirings 17 or the like. As above, the light emitting element array chip (or light emitting thyristor array chip) including the light emitting element devices (or light emitting element portions) 1 illustrated in FIGS. 1 and 2 is formed.

<1-4> Advantages

Figure 4:
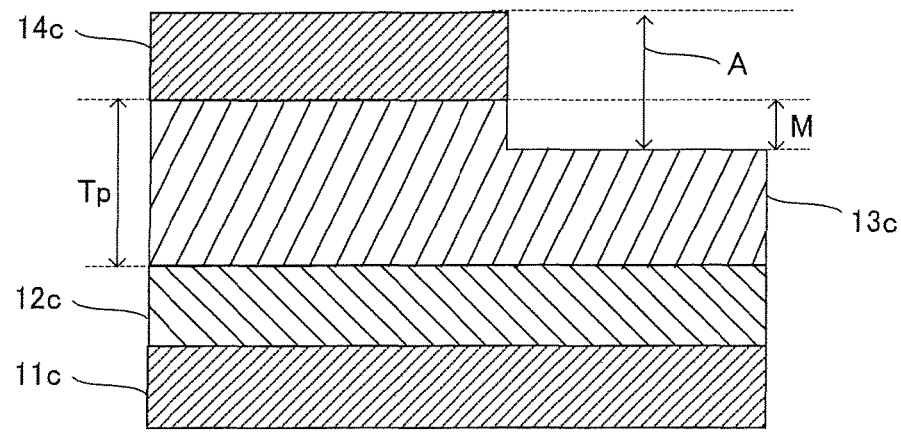
FIG. 4 is a sectional view illustrating an etching process of a comparative light emitting thyristor having no etching stop layer.

FIG. 4 is a sectional view illustrating an etching process of a comparative light emitting thyristor having no etching stop layer. The comparative light emitting thyristor includes a p-type anode layer 11c, an n-type gate layer 12c, a p-type gate layer 13c, and an n-type cathode layer 14c. The n-type cathode layer 14c and p-type gate layer 13c are etched as indicated by arrow A. As illustrated in FIG. 4, etching in the etching process of the comparative light emitting thyristor (or semiconductor layered structure) having no etching stop layer stops at a position in the p-type gate layer 13c. Thus, in the comparative light emitting thyristor having no etching stop layer, the p-type gate layer 13c needs to have a large thickness Tp including an etching margin M.

On the other hand, in the first embodiment, the etching in the etching process illustrated in FIG. 3B stops at the etching stop layer 15 above the p-type gate layer 13. Thus, the thickness $T_{13}$ (FIG. 2) of the p-type gate layer 13 need not include an etching margin, and can be minimized. As such, it is possible to reduce the thickness $T_{13}$ (FIG. 2) of the p-type gate layer 13, thereby improving the light extraction efficiency from the light emitting element device 1 and the switching characteristics of the light emitting element device 1.

Further, in the first embodiment, the gate electrode 93 is in contact with the p-type InGaP layer (or etching stop layer 15) containing no Al. Thus, surface oxidation of the gate electrode 93 is less likely to occur. This can reduce the contact resistance as compared with a case where the gate electrode 93 is disposed on an AlGaAs layer.

<2> Second Embodiment

<2-1> Light Emitting Element Device

Figure 5:
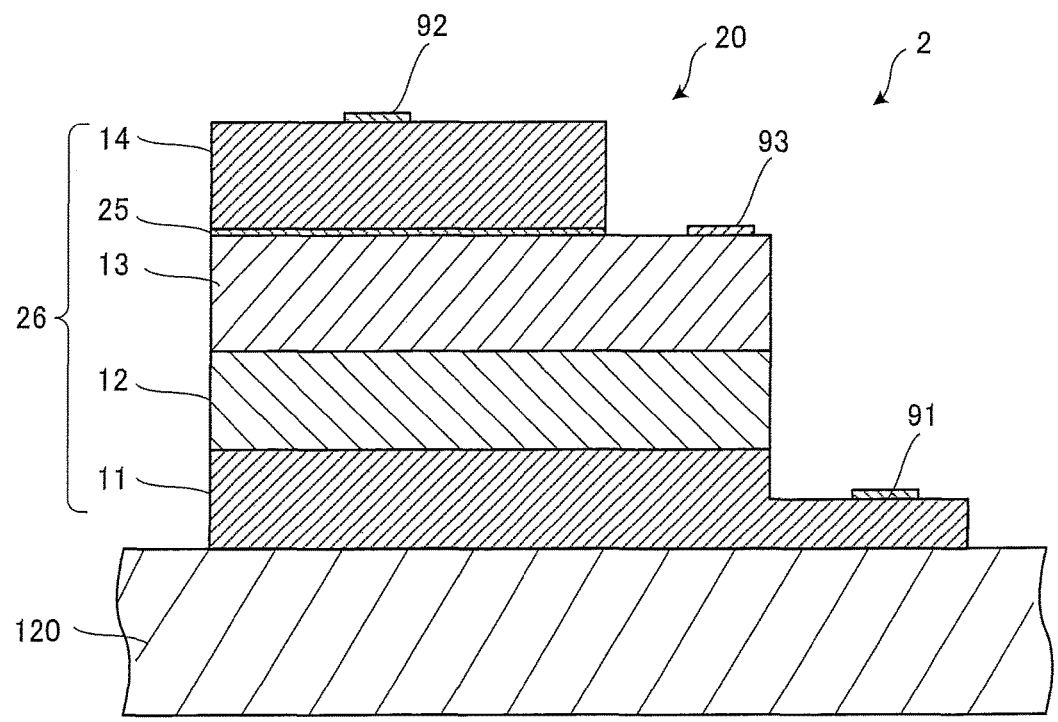
FIG. 5 is a sectional view schematically illustrating a configuration of a light emitting element device according to a second embodiment of the present invention.

FIG. 5 is a sectional view schematically illustrating a configuration of a light emitting element device 2 according to a second embodiment of the present invention. In FIG. 5, elements that are the same as or correspond to those illustrated in FIG. 2 are given the same reference characters. The light emitting element device 2 according to the second embodiment differs from the light emitting element device 1 according to the first embodiment in that an etching stop layer 25 is an n-type InGaP layer instead of a p-type InGaP layer, and the gate electrode 93 is formed on the p-type gate layer 13. Except for these differences, the light emitting element device 2 according to the second embodiment is the same as the light emitting element device 1 according to the first embodiment.

The light emitting element device 2 includes a light emitting thyristor portion (which may also be referred to as a light emitting element device) 20 including a light emitting thyristor 26, and a part of the semiconductor substrate 120 on which the light emitting thyristor portion 20 is provided.

<2-2> Manufacturing Process of Light Emitting Element Device

FIGS. 6A to 6F are sectional views schematically illustrating a manufacturing process of the light emitting element device 2 illustrated in FIG. 5. In FIGS. 6A to 6F, elements that are the same as or correspond to those illustrated in FIGS. 3A to 3F are given the same reference characters. The light emitting thyristor portion 20 of the light emitting element device 2 is produced on the production substrate 150 different from the semiconductor substrate 120 illustrated in FIG. 5.

Figure 6A:
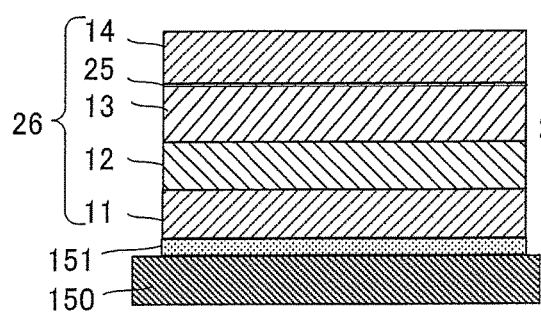
FIGS. 6A to 6F are sectional views schematically illustrating a manufacturing process of the light emitting element device illustrated in FIG. 5.

First, as illustrated in FIG. 6A, a layered structure consisting of the p-type anode layer (or p-type AlGaAs layer) 11, n-type gate layer (or n-type AlGaAs layer) 12, p-type gate layer (or p-type AlGaAs layer) 13, etching stop layer (or n-type InGaP layer) 25, and n-type cathode layer (or n-type AlGaAs layer) 14 is formed on the p-type AlAs layer (or separation layer) 151 provided on the production substrate

150. The etching stop layer 25 is a semiconductor layer having an etching rate lower than that of the semiconductor layer (in FIG. 5, the n-type cathode layer 14) adjacent to and above the etching stop layer 25. In this example, the etching stop layer 25 has an etching rate lower than that of each of the semiconductor layers (in FIG. 5, the p-type gate layer 13 and n-type cathode layer 14) adjacent to the etching stop layer 25.

Figure 6D:
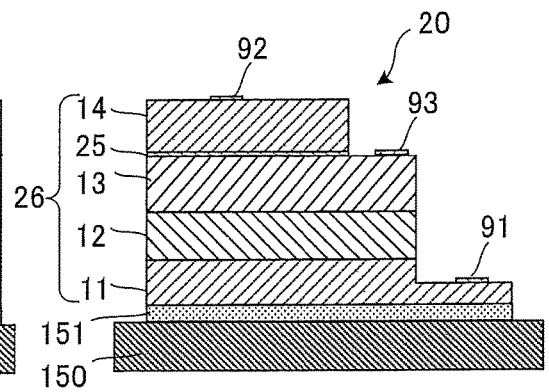
Figure 6B:
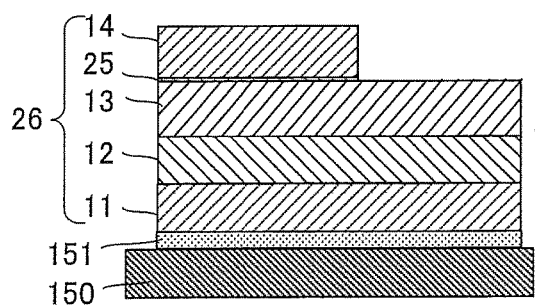

Next, as illustrated in FIG. 6B, the n-type cathode layer 14 is partially etched by wet etching using, for example, a mixture of phosphoric acid, hydrogen peroxide solution, and water, or other etchants. This etching stops at the etching stop layer 25 formed of InGaP. Then, as illustrated in FIG. 6B, the etching stop layer 25 is partially removed by using, for example, hydrochloric acid so that the p-type gate layer 13 is partially exposed. The exposed region of the upper surface of the p-type gate layer 13 includes a region on which the gate electrode 93 (FIG. 6D) is to be formed.

Figure 6E:
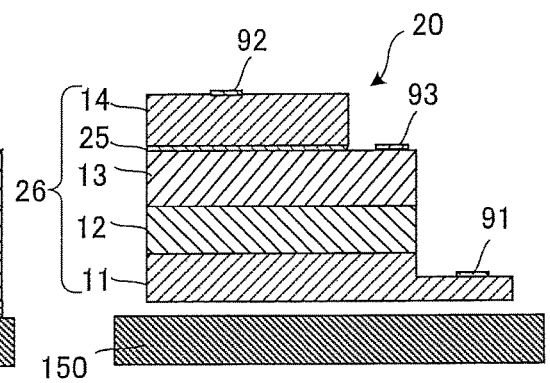
Figure 6C:
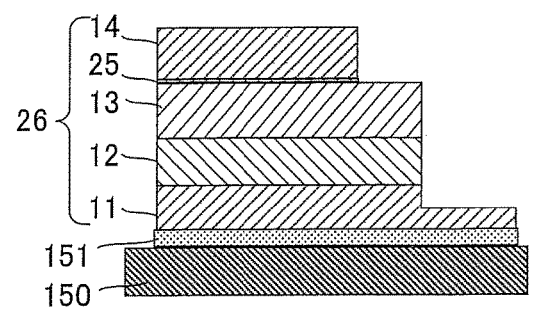

Next, as illustrated in FIG. 6C, by wet etching using a mixture that is the same as the above-described mixture, the p-type gate layer 13 and n-type gate layer 12 are partially removed, and a part of the p-type anode layer 11 is etched, so that a region on which the anode electrode 91 is to be formed is formed.

Next, as illustrated in FIG. 6D, the anode electrode 91 is formed on the p-type anode layer 11, the cathode electrode 92 is formed on the n-type cathode layer 14, and the gate electrode 93 is formed on the p-type gate layer 13, so that the light emitting thyristor portion 20 including the light emitting thyristor 26 is formed. The light emitting thyristor 26, which is, for example, an epitaxial film, can be separated from the production substrate 150 by etching the separation layer 151 and can be attached or bonded onto another substrate.

Figure 6F:
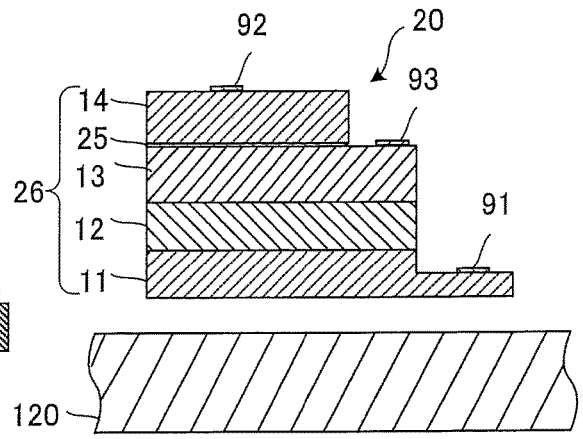

The subsequent processes illustrated in FIGS. 6E and 6F are the same as those illustrated in FIGS. 3E and 3F.

<2-3> Advantages

As described above, in the light emitting element device 2 according to the second embodiment, the etching in the etching process illustrated in FIG. 6B stops at the etching stop layer 25 above the p-type gate layer 13. Thus, the thickness of the p-type gate layer 13 can be minimized. As such, it is possible to reduce the thickness of the p-type gate layer 13, thereby improving the light extraction efficiency from the light emitting element device 2 and the switching characteristics of the light emitting element device 2.

Further, since the etching stop layer 25 is an n-type InGaP layer containing no Al, the etching stop layer 25 is less likely to be affected by residual oxygen in the p-type gate layer 13. Further, since the etching stop layer 25 is an n-type InGaP layer containing no Al, it is possible to reduce effects of surface recombination or a donor trap, such as a DX center, thereby improving the electrical characteristics of the light emitting element device 2.

<3> Third Embodiment

<3-1> Light Emitting Element Device

Figure 7:
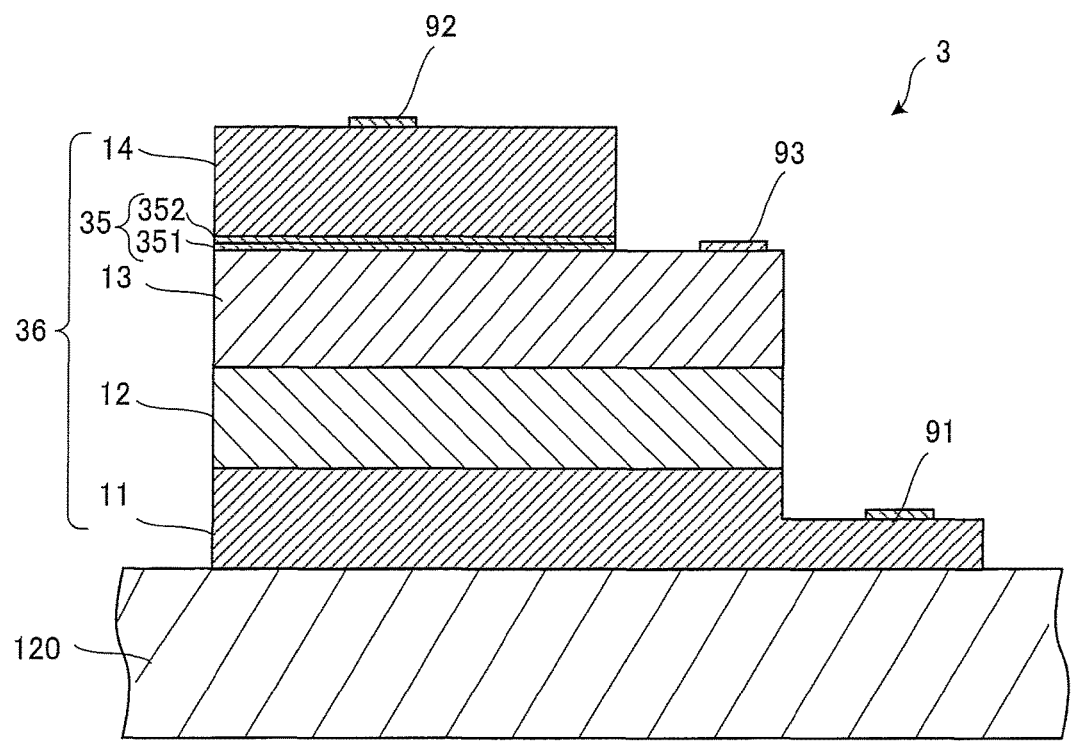
FIG. 7 is a sectional view schematically illustrating a configuration of a light emitting element device according to a third embodiment of the present invention.

FIG. 7 is a sectional view schematically illustrating a configuration of a light emitting element device 3 according to a third embodiment of the present invention. In FIG. 7, elements that are the same as or correspond to those illustrated in FIGS. 2 and 5 are given the same reference characters. The light emitting element device 3 according to the third embodiment differs from the light emitting element device 2 according to the second embodiment in that an etching stop layer 35 has a layered structure including a p-type InGaP layer 351 and an n-type InGaP layer 352. The etching stop layer 35 is a semiconductor layer having an etching rate lower than that of the semiconductor layer (in FIG. 7, the n-type cathode layer 14) adjacent to and above the etching stop layer 35. In this example, the etching stop layer 35 has an etching rate lower than that of each of the semiconductor layers (in FIG. 7, the p-type gate layer 13 and n-type cathode layer 14) adjacent to the etching stop layer 35. Except for this difference, the light emitting element device 3 according to the third embodiment is the same as the light emitting element device 2 according to the second embodiment.

<3-2> Manufacturing Process of Light Emitting Element Device

A manufacturing process of the light emitting element device 3 is the same as the manufacturing process of the light emitting element device 2 illustrated in FIGS. 6A to 6F, except that the layered structure including the p-type InGaP layer 351 and an n-type InGaP layer 352 is formed as the etching stop layer 35.

<3-3> Advantages

In the light emitting element device 3 according to the third embodiment, as in the second embodiment, the thickness of the p-type gate layer 13 can be minimized. This can improve the light extraction efficiency from the light emitting element device 3 and the switching characteristics of the light emitting element device 3.

Further, in the light emitting element device 3 according to the third embodiment, in addition to the advantages of the light emitting element device 2 according to the second embodiment, the following advantage can be obtained. The interface between the cathode layer and the gate layer is formed by a homojunction of InGaP. This can reduce effects of an energy barrier due to band gap discontinuity.

<3-4> Modification

The etching stop layer 15 in the first embodiment may also be an etching stop layer having a layered structure including a p-type InGaP layer and an n-type InGaP layer.

<4> Fourth Embodiment

<4-1> Light Emitting Element Device

Figure 8:
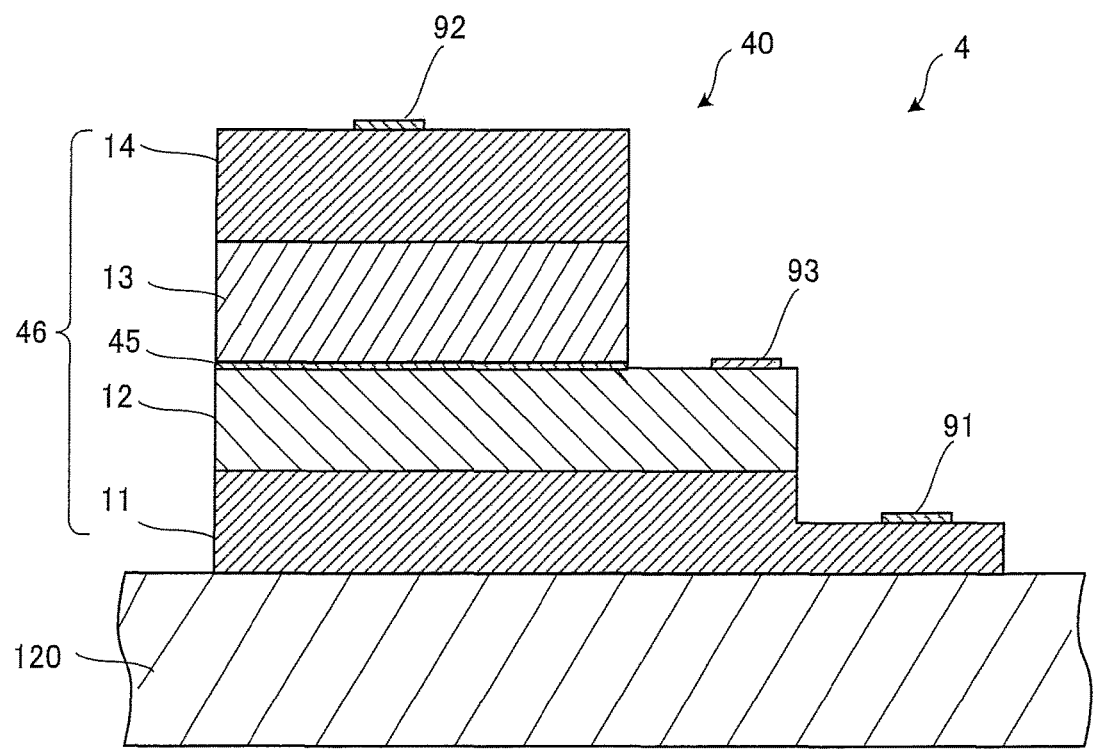
FIG. 8 is a sectional view schematically illustrating a configuration of a light emitting element device according to a fourth embodiment of the present invention.

FIG. 8 is a sectional view schematically illustrating a configuration of a light emitting element device 4 according to a fourth embodiment of the present invention. In FIG. 8, elements that are the same as or correspond to those illustrated in FIGS. 2, 5, and 7 are given the same reference characters. The light emitting element device 4 according to the fourth embodiment differs from the light emitting element device 2 according to the second embodiment in that an etching stop layer 45 is formed on a surface of the p-type gate layer 13 on the n-type gate layer 12 side (between the p-type gate layer 13 and the n-type gate layer 12), and the gate electrode 93 is formed on a surface of the n-type gate layer 12. Except for these differences, the light emitting element device 4 according to the fourth embodiment is the same as the light emitting element device 2 according to the second embodiment.

The light emitting element device 4 includes a light emitting thyristor portion (which may also be referred to as a light emitting element device) 40 including a light emitting thyristor 46, and a part of the semiconductor substrate 120 on which the light emitting thyristor portion 40 is provided.

<4-2> Manufacturing Process of Light Emitting Element Device

FIGS. 9A to 9F are sectional views schematically illustrating a manufacturing process of the light emitting element device 4 illustrated in FIG. 8. In FIGS. 9A to 9F, elements that are the same as or correspond to those illustrated in FIGS. 6A to 6F are given the same reference characters. The light emitting thyristor portion 40 of the light emitting element device 4 is produced on the production substrate 150 different from the semiconductor substrate 120 illustrated in FIG. 8.

Figure 9A:
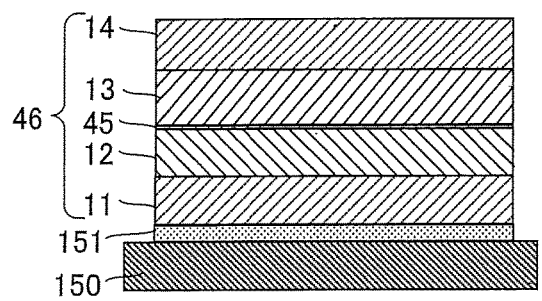
FIGS. 9A to 9F are sectional views schematically illustrating a manufacturing process of the light emitting element device illustrated in FIG. 8.

First, as illustrated in FIG. 9A, a layered structure consisting of the p-type anode layer (or p-type AlGaAs layer) 11, n-type gate layer (or n-type AlGaAs layer) 12, etching stop layer (or n-type InGaP layer) 45, p-type gate layer (or p-type AlGaAs layer) 13, and n-type cathode layer (or n-type AlGaAs layer) 14 is formed on the p-type AlAs layer (or separation layer) 151 provided on the production substrate 150.

Figure 9D:
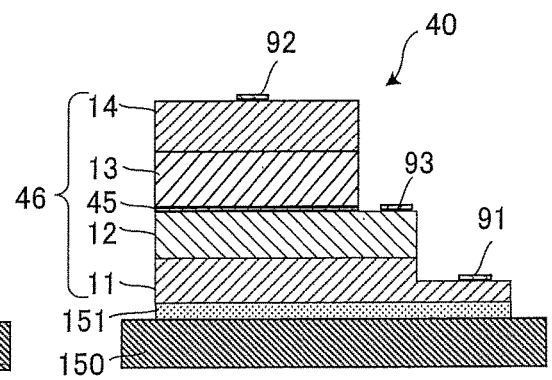
Figure 9B:
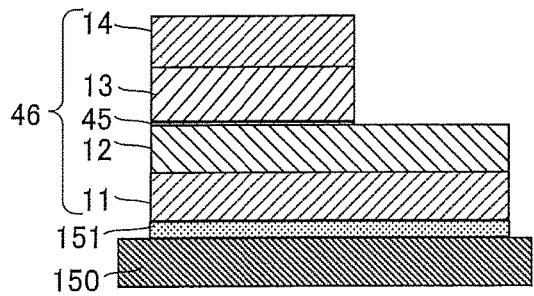

Next, as illustrated in FIG. 9B, the n-type cathode layer 14 and p-type gate layer 13 are partially etched by wet etching using, for example, a mixture of phosphoric acid, hydrogen peroxide solution, and water, or other etchants. This etching stops at the etching stop layer 45 formed of InGaP. Then, as illustrated in FIG. 9B, the etching stop layer 45 is partially removed by using, for example, hydrochloric acid so that the n-type gate layer 12 is partially exposed. The exposed region of the upper surface of the n-type gate layer 12 includes a region on which the gate electrode 93 (FIG. 9D) is to be formed.

Figure 9E:
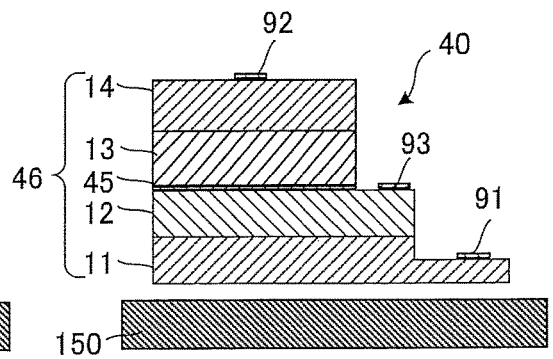
Figure 9C:
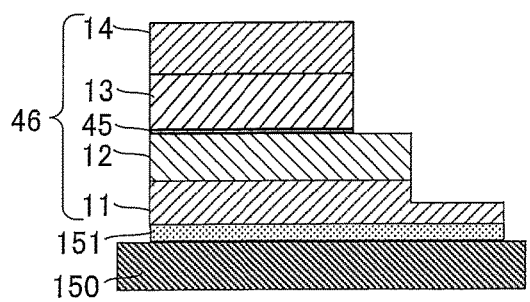

Next, as illustrated in FIG. 9C, by wet etching using a mixture that is the same as the above-described mixture, the n-type gate layer 12 is partially removed, and a part of the p-type anode layer 11 is etched, so that a region on which the anode electrode 91 is to be formed is formed.

Next, as illustrated in FIG. 9D, the anode electrode 91 is formed on the p-type anode layer 11, the cathode electrode 92 is formed on the n-type cathode layer 14, and the gate electrode 93 is formed on the n-type gate layer 12, so that the light emitting thyristor portion 40 including the light emitting thyristor 46 is formed. The light emitting thyristor 46, which is, for example, an epitaxial film, can be separated from the production substrate 150 by etching the separation layer 151 and can be attached or bonded onto another substrate.

Figure 9F:
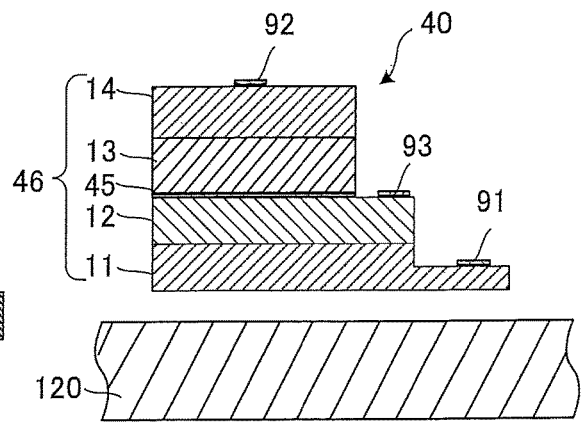

The subsequent processes illustrated in FIGS. 9E and 9F are the same as those illustrated in FIGS. 3E and 3F, and FIGS. 6E and 6F.

<4-3> Advantages

As described above, in the light emitting element device 4 according to the fourth embodiment, the etching stop layer 45 is formed between the p-type gate layer 13 and the n-type gate layer 12, and the gate electrode 93 is formed on the n-type gate layer 12, as illustrated in FIG. 8. Thus, the etching in the etching process stops at the etching stop layer 45 above the n-type gate layer 12. Thus, the thickness of the p-type gate layer 13 can be minimized. As such, it is possible to reduce the thickness of the p-type gate layer 13, thereby improving the light extraction efficiency from the light emitting element device 4 and the switching characteristics of the light emitting element device 4.

In the light emitting element device 4 according to the fourth embodiment, the etching stop layer (or n-type InGaP layer) 45 is formed between the p-type gate layer 13 and the n-type gate layer 12. This forms a heterojunction having a barrier at the interface, preventing carrier transport. However, when current flows through the light emitting element device 4, the pn junction between the p-type gate layer 13 and the n-type gate layer 12 is a depletion layer region, and thus the barrier at the interface does not affect characteristics of the light emitting element device 4. Thus, the light emitting element device 4 according to the fourth embodiment can have improved switching characteristics.

<4-4> Modification

The etching stop layer 45 in the fourth embodiment may be an etching stop layer having a layered structure including an n-type InGaP layer and a p-type InGaP layer.

<5> Fifth Embodiment

<5-1> Light Emitting Element Device

Figure 10:
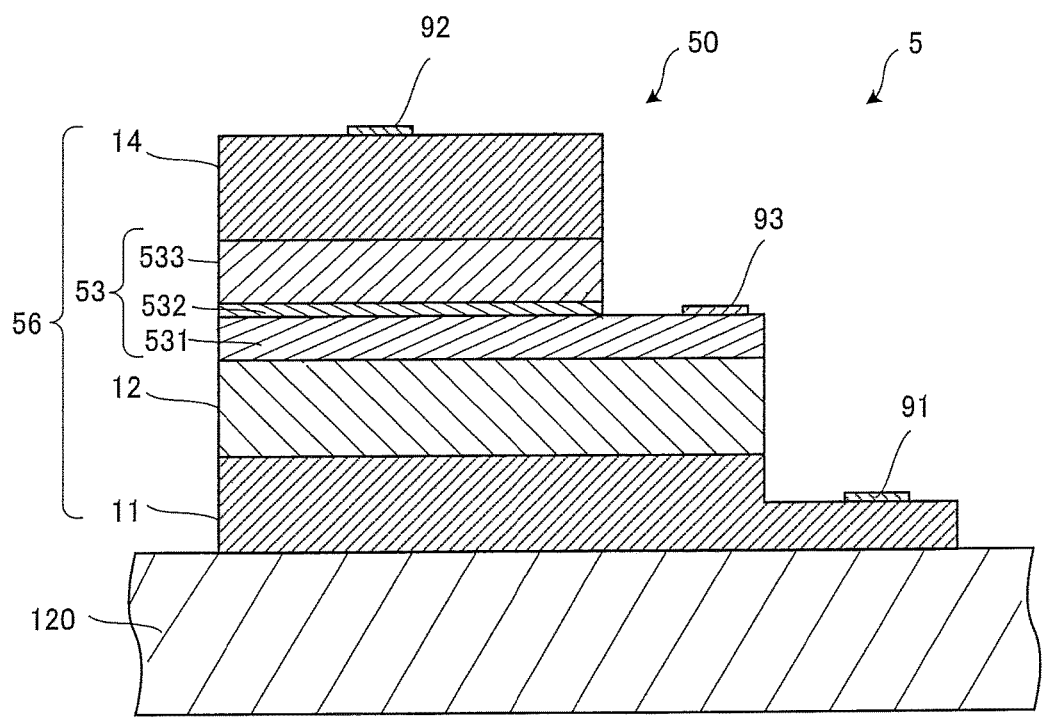
FIG. 10 is a sectional view schematically illustrating a configuration of a light emitting element device according to a fifth embodiment of the present invention.

FIG. 10 is a sectional view schematically illustrating a configuration of a light emitting element device 5 according to a fifth embodiment of the present invention. In FIG. 10, elements that are the same as or correspond to those illustrated in FIGS. 2 and 5 are given the same reference characters. The light emitting element device 5 according to the fifth embodiment differs from the light emitting element device 2 according to the second embodiment in that a third semiconductor layer 53 includes a first layer 531, a second layer 532 adjacent to a surface of the first layer 531 on the fourth semiconductor layer 14 side, and a third layer 533 adjacent to a surface of the second layer 532 on the fourth semiconductor layer 14 side, and the second layer 532 is an etching stop layer. For example, the first layer 531 is a p-type AlGaAs layer, the second layer 532 is a p-type InGaP layer, and the third layer 533 is a p-type AlGaAs layer. Except for this difference, the light emitting element device 5 according to the fifth embodiment is the same as the light emitting element device 2 according to the second embodiment.

The light emitting element device 5 includes a light emitting thyristor portion (which may also be referred to as a light emitting element device) 50 including a light emitting thyristor 56, and a part of the semiconductor substrate 120 on which the light emitting thyristor portion 50 is provided.

<5-2> Manufacturing Process of Light Emitting Element Device

FIGS. 11A to 11F are sectional views schematically illustrating a manufacturing process of the light emitting element device 5 illustrated in FIG. 10. In FIGS. 11A to 11F, elements that are the same as or correspond to those illustrated in FIGS. 6A to 6F are given the same reference characters. The light emitting thyristor portion 50 of the light emitting element device 5 is produced on the production substrate 150 different from the semiconductor substrate 120 illustrated in FIG. 10.

Figure 11A:
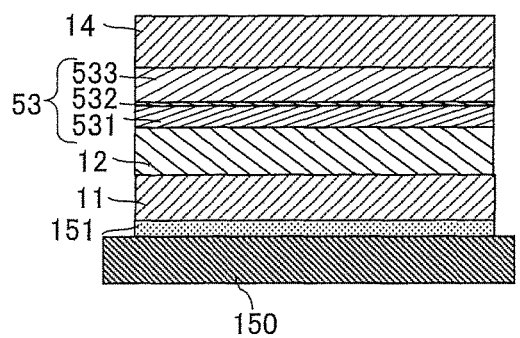
FIGS. 11A to 11F are sectional views schematically illustrating a manufacturing process of the light emitting element device illustrated in FIG. 10.

First, as illustrated in FIG. 11A, a layered structure consisting of the p-type anode layer (or p-type AlGaAs layer) 11, the n-type gate layer (or n-type AlGaAs layer) 12, the first layer (or p-type AlGaAs layer) 531 of the p-type gate layer 53, the second layer (or p-type InGaP layer) 532, which is an etching stop layer, the third layer (or p-type AlGaAs layer) 533 of the p-type gate layer 53, and the n-type cathode layer (or n-type AlGaAs layer) 14 is formed on the p-type AlAs layer (or separation layer) 151 provided on the production substrate 150. The second layer 532, which is an etching stop layer, is a semiconductor layer having an etching rate lower than that of the semiconductor layer (in FIG. 10, the third layer 533) adjacent to and above the second layer 532. In this example, the second layer 532 has an etching rate lower than that of each of the semiconductor layers (in FIG. 10, the first layer 531 and third layer 533 of the p-type gate layer 53) adjacent to the second layer 532.

Figure 11D:
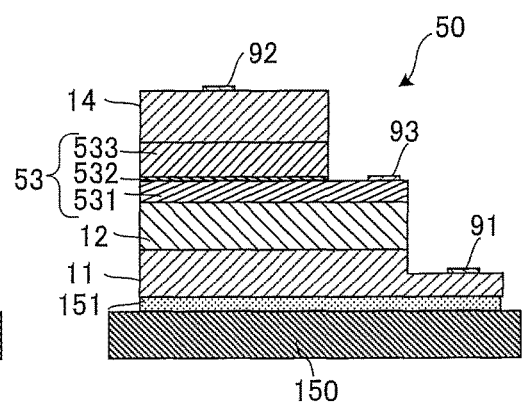
Figure 11B:
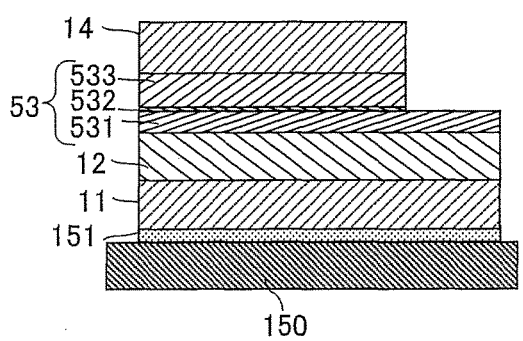

Next, as illustrated in FIG. 11B, the n-type cathode layer 14 and third layer 533 are partially etched by wet etching using, for example, a mixture of phosphoric acid, hydrogen peroxide solution, and water, or other etchants. This etching stops at the second layer 532, which is an etching stop layer, formed of InGaP. Then, as illustrated in FIG. 11B, the second layer 532, which is an etching stop layer, is partially removed by using, for example, hydrochloric acid so that the first layer 531 of the p-type gate layer 53 is partially exposed. The exposed region of the upper surface of the first layer 531 of the p-type gate layer 53 is a region on which the gate electrode 93 (FIG. 11D) is to be formed.

Figure 11E:
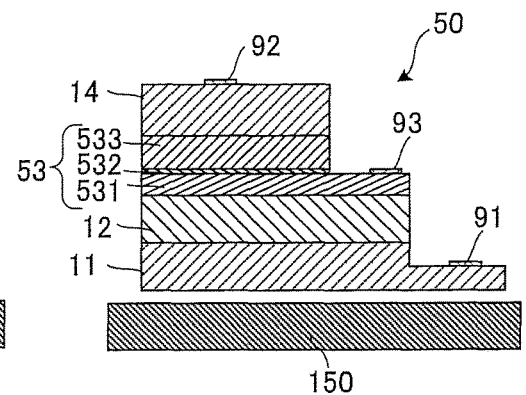
Figure 11C:
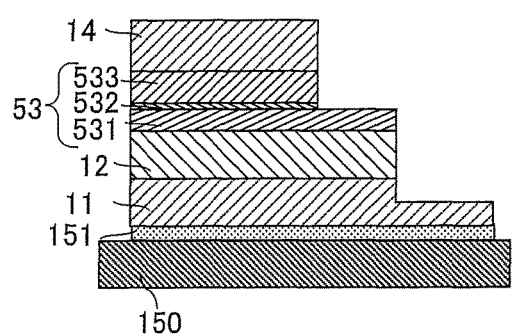

Next, as illustrated in FIG. 11C, by wet etching using a mixture that is the same as the above-described mixture, the first layer 531 of the p-type gate layer 53 and n-type gate layer 12 are partially removed, and a part of the p-type anode layer 11 is etched, so that a region on which the anode electrode 91 is to be formed is formed.

Next, as illustrated in FIG. 11D, the anode electrode 91 is formed on the p-type anode layer 11, the cathode electrode 92 is formed on the n-type cathode layer 14, and the gate electrode 93 is formed on the first layer 531 of the p-type gate layer 53, so that the light emitting thyristor portion 50 including the light emitting thyristor 56 is formed. The light emitting thyristor 56, which is, for example, an epitaxial film, can be separated from the production substrate 150 by etching the separation layer 151 and can be attached or bonded onto another substrate.

Figure 11F:
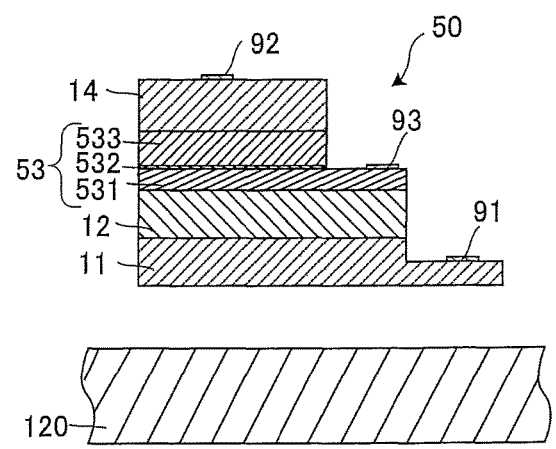

The subsequent processes illustrated in FIGS. 11E and 11F are the same as those illustrated in FIGS. 3E and 3F.

<5-3> Advantages

As described above, in the light emitting element device 5 according to the fifth embodiment, the etching in the etching process illustrated in FIG. 11B stops at the second layer (or etching stop layer) 532 in the p-type gate layer 53. Thus, the thickness of the p-type gate layer 53 can be minimized. As such, it is possible to reduce the thickness of the p-type gate layer 53, thereby improving the light extraction efficiency from the light emitting element device 5 and the switching characteristics of the light emitting element device 5.

Further, in the light emitting element device 5 according to the fifth embodiment, the second layer 532, which is an etching stop layer, is a semiconductor layer formed in the p-type gate layer 53 and having the same conductivity type as the first layer 531 and third layer 533. Thus, it is possible to reduce effects of energy barrier due to a pn junction, thereby improving the switching characteristics.

<6> Sixth Embodiment

<6-1> Light Emitting Element Device

Figure 12:
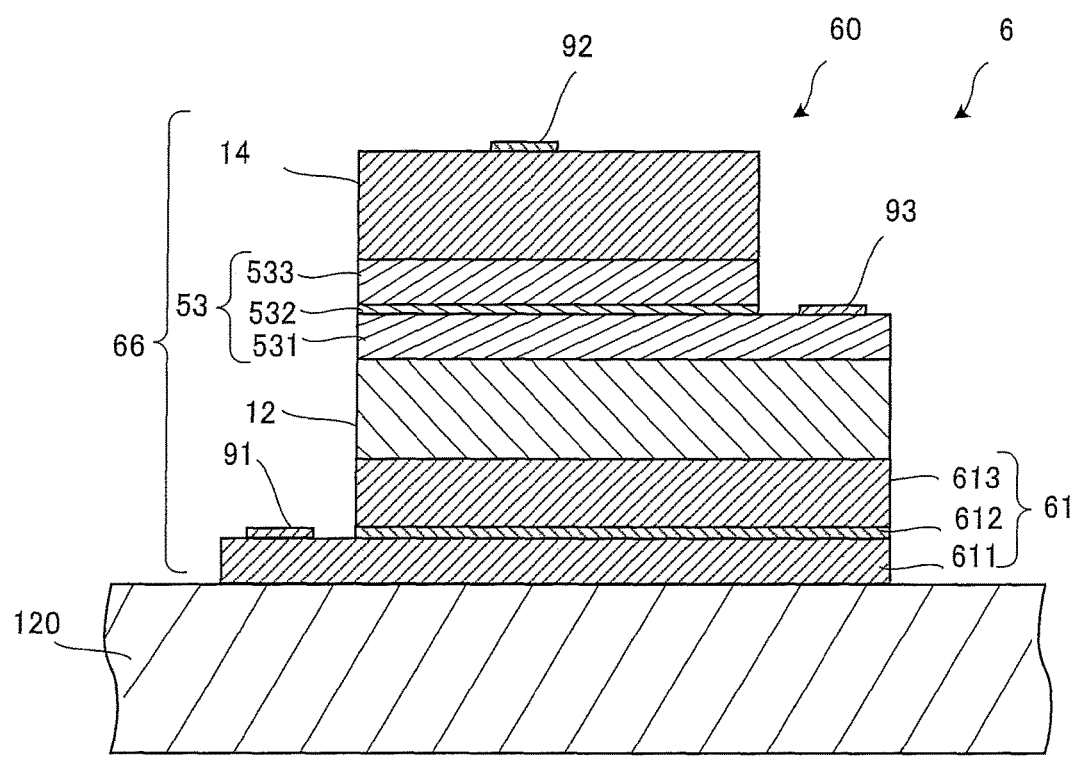
FIG. 12 is a sectional view schematically illustrating a configuration of a light emitting element device according to a sixth embodiment of the present invention.

FIG. 12 is a sectional view schematically illustrating a configuration of a light emitting element device 6 according to a sixth embodiment of the present invention. In FIG. 12, elements that are the same as or correspond to those illustrated in FIG. 10 (or the fifth embodiment) are given the same reference characters. The light emitting element device 6 according to the sixth embodiment differs from the light emitting element device 5 according to the fifth embodiment in that it includes, in addition to the etching stop layer (also referred to as the first etching stop layer) 532, another etching stop layer (also referred to as the second etching stop layer), which is a second layer 612 described later, in a p-type anode layer 61. Except for this difference, the light emitting element device 6 according to the sixth embodiment is the same as the light emitting element device 5 according to the fifth embodiment.

The light emitting element device 6 includes a light emitting thyristor portion (which may also be referred to as a light emitting element device) 60 including a light emitting thyristor 66, and a part of the semiconductor substrate 120 on which the light emitting thyristor portion 60 is provided.

<6-2> Manufacturing Process of Light Emitting Element Device

FIGS. 13A to 13F are sectional views schematically illustrating a manufacturing process of the light emitting element device 6 illustrated in FIG. 12. In FIGS. 13A to 13F, elements that are the same as or correspond to those illustrated in FIGS. 11A to 11F are given the same reference characters. The light emitting thyristor portion 60 of the light emitting element device 6 is produced on the production substrate 150 different from the semiconductor substrate 120 illustrated in FIG. 12.

Figure 13A:
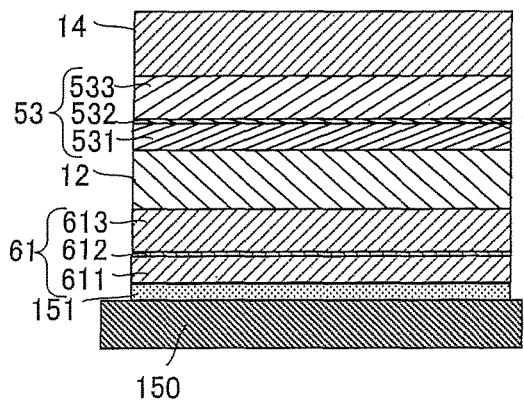
FIGS. 13A to 13F are sectional views schematically illustrating a manufacturing process of the light emitting element device illustrated in FIG. 12.

First, as illustrated in FIG. 13A, a layered structure consisting of a first layer (or p-type AlGaAs layer) 611 of the p-type anode layer 61, the second layer (or p-type InGaP layer) 612, which is the second etching stop layer, of the p-type anode layer 61, a third layer (or p-type AlGaAs layer) 613 of the p-type anode layer 61, the n-type gate layer (or n-type AlGaAs layer) 12, the first layer (or p-type AlGaAs layer) 531 of the p-type gate layer 53, the second layer (or p-type InGaP layer) 532, which is the first etching stop layer, the third layer (or p-type AlGaAs layer) 533 of the p-type gate layer 53, and the n-type cathode layer (or n-type AlGaAs layer) 14 is formed on the p-type AlAs layer (or separation layer) 151 provided on the production substrate 150. The second layer 532, which is the first etching stop layer, is a semiconductor layer having an etching rate lower than that of the semiconductor layer (in FIG. 12, the third layer 533) adjacent to and above the second layer 532. In this example, the second layer 532 has an etching rate lower than that of each of the semiconductor layers (in FIG. 12, the first layer 531 and third layer 533 of the p-type gate layer 53) adjacent to the second layer 532. The second layer 612, which is the second etching stop layer, is a semiconductor layer having an etching rate lower than that of the semiconductor layer (in FIG. 12, the third layer 613) adjacent to and above the second layer 612. In this example, the second layer 612 has an etching rate lower than that of each of the semiconductor layers (in FIG. 12, the first layer 611 and third layer 613 of the p-type anode layer 61) adjacent to the second layer 612.

Figure 13D:
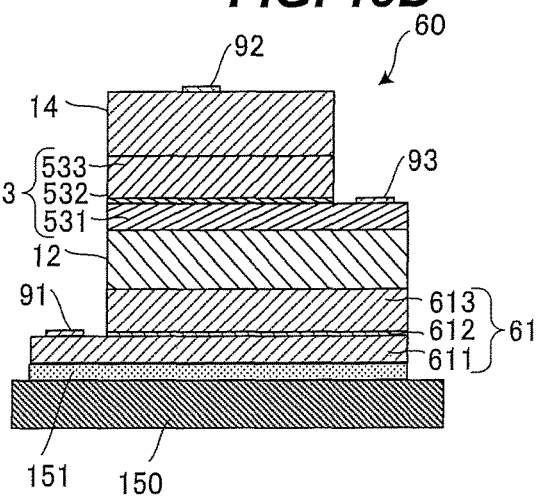
Figure 13B:
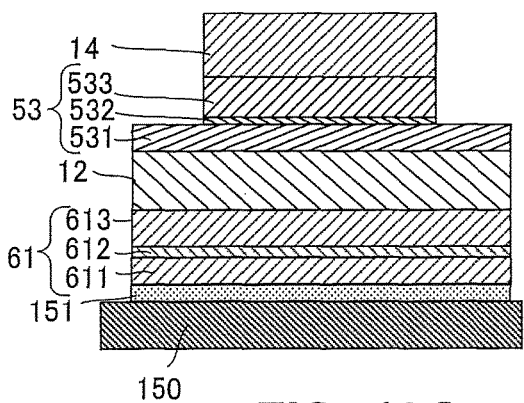

Next, as illustrated in FIG. 13B, the n-type cathode layer 14 and third layer 533 are partially etched by wet etching using, for example, a mixture of phosphoric acid, hydrogen peroxide solution, and water, or other etchants. This etching stops at the second layer 532, which is the first etching stop layer, formed of InGaP. Then, as illustrated in FIG. 13B, the second layer 532 is partially removed by using, for example, hydrochloric acid so that the first layer 531 of the p-type gate layer 53 is partially exposed. The exposed region of the upper surface of the first layer 531 of the p-type gate layer 53 includes a region on which the gate electrode 93 (FIG. 13D) is to be formed.

Figure 13E:
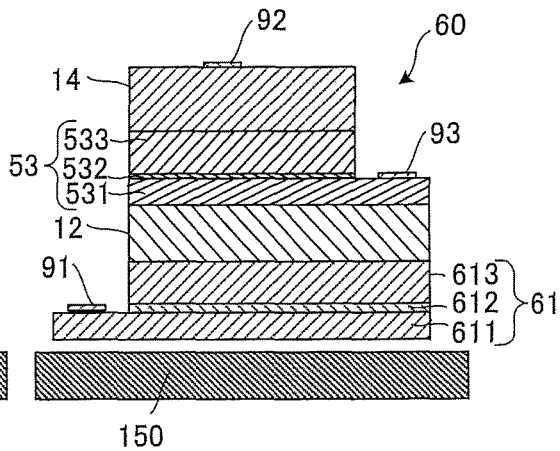
Figure 13C:
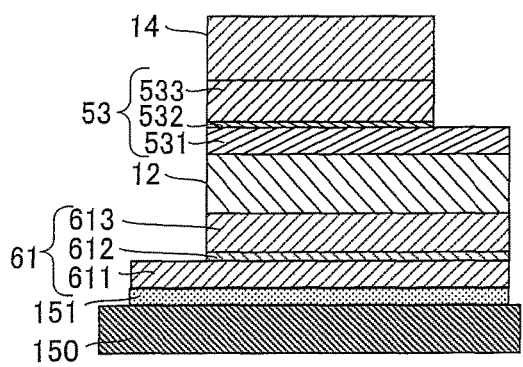

Next, as illustrated in FIG. 13C, by wet etching using a mixture that is the same as the above-described mixture, the first layer 531 of the p-type gate layer 53, the n-type gate layer 12, and the third layer 613 of the p-type anode layer 61 are partially etched. This etching stops at the second layer 612, which is the second etching stop layer, formed of InGaP. Then, as illustrated in FIG. 13C, the second layer 612 is partially removed by using, for example, hydrochloric acid so that the first layer 611 of the p-type anode layer 61 is partially exposed. The exposed region of the upper surface of the first layer 611 of the p-type anode layer 61 includes a region on which the anode electrode 91 (FIG. 13D) is to be formed.

Next, as illustrated in FIG. 13D, the anode electrode 91 is formed on the first layer 611 of the p-type anode layer 61, the cathode electrode 92 is formed on the n-type cathode layer 14, and the gate electrode 93 is formed on the first layer 531 of the p-type gate layer 53, so that the light emitting thyristor portion 60 including the light emitting thyristor 66 is formed. The light emitting thyristor 66, which is, for example, an epitaxial film, can be separated from the production substrate 150 by etching the separation layer 151 and can be attached or bonded onto another substrate.

Figure 13F:
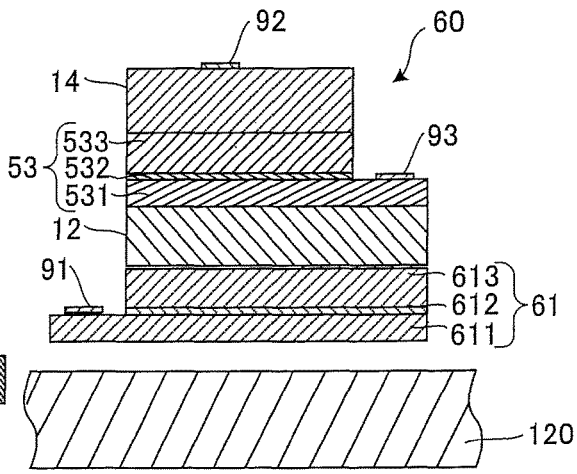

The subsequent processes illustrated in FIGS. 13E and 13F are the same as those illustrated in FIGS. 11E and 11F.

<6-3> Advantages

As described above, in the light emitting element device 6 according to the sixth embodiment, the etching in the etching process illustrated in FIG. 13B stops at the second layer (or first etching stop layer) 532 in the p-type gate layer 53. Thus, the thickness of the p-type gate layer 53 can be minimized. As such, it is possible to reduce the thickness of the p-type gate layer 53, thereby improving the light extraction efficiency from the light emitting element device 6 and the switching characteristics of the light emitting element device 6.

Further, in the light emitting element device 6 according to the sixth embodiment, the second layer 532, which is an etching stop layer, is a semiconductor layer formed in the p-type gate layer 53 and having the same conductivity type as the first layer 531 and third layer 533. Thus, it is possible to reduce effects of energy barrier due to a pn junction, thereby improving the switching characteristics.

Further, in the light emitting element device 6 according to the sixth embodiment, the etching in the etching process illustrated in FIG. 13C stops at the second layer (or second etching stop layer) 612 in the p-type anode layer 61. Thus, the thickness of the p-type anode layer 61 can be minimized. As such, it is possible to reduce the thickness of the p-type anode layer 61, thereby improving the light extraction efficiency from the light emitting element device 6 when back surface reflection is used (or when a light reflecting surface made of, for example, metal is disposed on a surface of the substrate 120), and improving the switching characteristics of the light emitting element device 6.

<7> Seventh Embodiment

<7-1> Light Emitting Element Device

Figure 14:
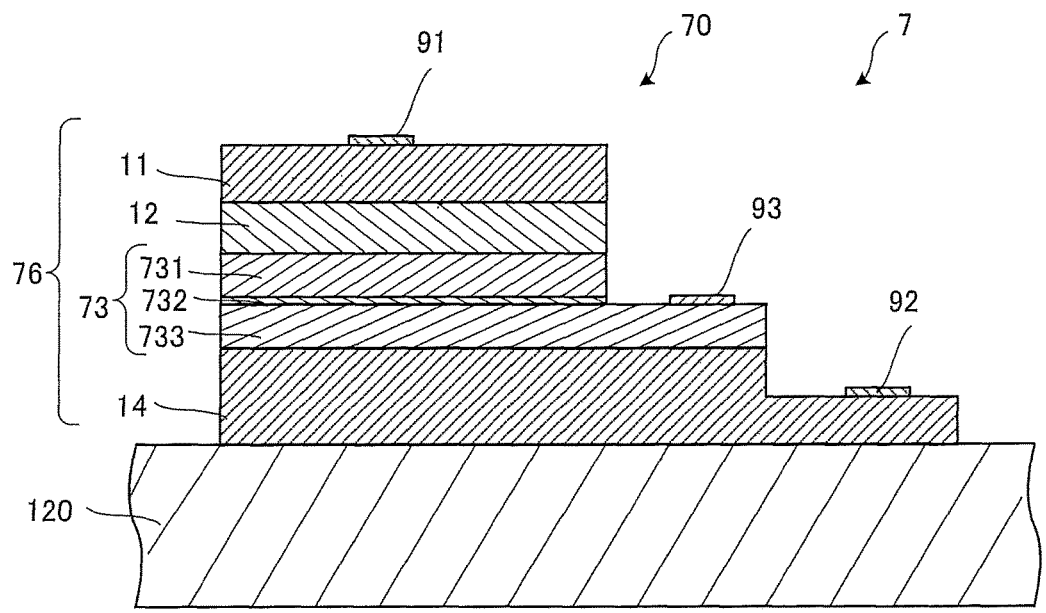
FIG. 14 is a sectional view schematically illustrating a configuration of a light emitting element device according to a seventh embodiment of the present invention.

FIG. 14 is a sectional view schematically illustrating a configuration of a light emitting element device 7 according to a seventh embodiment of the present invention. In FIG. 14, elements that are the same as or correspond to those illustrated in FIG. 10 (or the fifth embodiment) are given the same reference characters. The light emitting element device 7 according to the seventh embodiment differs from the light emitting element device 5 according to the fifth embodiment in the following two points.

Firstly, in the seventh embodiment, the fourth semiconductor layer (or n-type cathode layer) 14 of the second conductivity type, the third semiconductor layer (or p-type gate layer) 73 of the first conductivity type, the second semiconductor layer (or n-type gate layer) 12 of the second conductivity type, and the first semiconductor layer (or p-type anode layer) 11 of the first conductivity type are layered in this order on the semiconductor substrate 120.

Secondly, the third semiconductor layer (or p-type gate layer) 73 includes a third layer 733, a second layer 732 adjacent to a surface of the third layer 733 on the second semiconductor layer 12 side, and a first layer 731 adjacent to a surface of the second layer 732 on the second semiconductor layer 12 side; the second layer 732 is an etching stop layer. For example, the third layer 733 is a p-type AlGaAs layer, the second layer 732 is a p-type InGaP layer and serves as an etching stop layer, and the first layer 731 is a p-type AlGaAs layer. The gate electrode 93 is provided on the third layer 733.

Except for these differences, the light emitting element device 7 according to the seventh embodiment is the same as the light emitting element device 5 according to the fifth embodiment.

The light emitting element device 7 includes a light emitting thyristor portion (which may also be referred to as a light emitting element device) 70 including a light emitting thyristor 76, and a part of the semiconductor substrate 120 on which the light emitting thyristor portion 70 is provided.

<7-2> Manufacturing Process of Light Emitting Element Device

The light emitting element device 7 is produced as follows, for example. First, the light emitting thyristor 76 is formed on an n-type AlAs layer (or separation layer) on a production substrate. The light emitting thyristor 76 has a layered structure consisting of the n-type cathode layer (or n-type AlGaAs layer) 14, the third layer (or p-type AlGaAs layer) 733 of the p-type gate layer 73, the second layer (or p-type InGaP layer) 732, which is an etching stop layer, the first layer (or p-type AlGaAs layer) 731 of the p-type gate layer 73, the n-type gate layer (or n-type AlGaAs layer) 12, and the p-type anode layer (or p-type AlGaAs layer) 15. The second layer 732, which is an etching stop layer, is a semiconductor layer having an etching rate lower than that of the semiconductor layer (in FIG. 14, the first layer 731) adjacent to and above the second layer 732. In this example, the second layer 732 has an etching rate lower than that of each of the semiconductor layers (in FIG. 14, the first layer 731 and third layer 733 of the p-type gate layer 73) adjacent to the second layer 732.

Next, by wet etching, the third layer 733 of the p-type gate layer 73 is partially exposed, so that a region on which the gate electrode 93 is to be formed is formed.

Next, by wet etching, the third layer 733 of the p-type gate layer 73 and a part of the n-type cathode layer 14 are etched, so that a region on which the cathode electrode 92 is to be formed is formed.

Next, the anode electrode 91 is formed on the p-type anode layer 11, the cathode electrode 92 is formed on the n-type cathode layer 14, and the gate electrode 93 is formed on the third layer 733 of the p-type gate layer 73, so that the light emitting thyristor portion 70 including the light emitting thyristor 76 is formed. The light emitting thyristor 76, which is, for example, an epitaxial film, can be separated from the production substrate and can be attached or bonded onto another substrate.

Next, the light emitting thyristor portion 70 is separated from the production substrate and bonded onto the semiconductor substrate 120.

<7-3> Advantages

As described above, in the light emitting element device 7 according to the seventh embodiment, the etching in the etching process stops at the second layer 732, which is an etching stop layer, in the p-type gate layer 73. Thus, the thickness of the p-type gate layer 73 can be minimized. As such, it is possible to reduce the thickness of the p-type gate layer 73, thereby improving the light extraction efficiency from the light emitting element device 7 and the switching characteristics of the light emitting element device 7.

Further, in the light emitting element device 7 according to the seventh embodiment, the second layer 732, which is an etching stop layer, is a semiconductor layer formed in the p-type gate layer 73 and having the same conductivity type as the first layer 731 and third layer 733. Thus, it is possible to reduce effects of energy barrier due to a pn junction, thereby improving the switching characteristics.

<8> Eighth Embodiment

<8-1> Light Emitting Element Device

Figure 15:
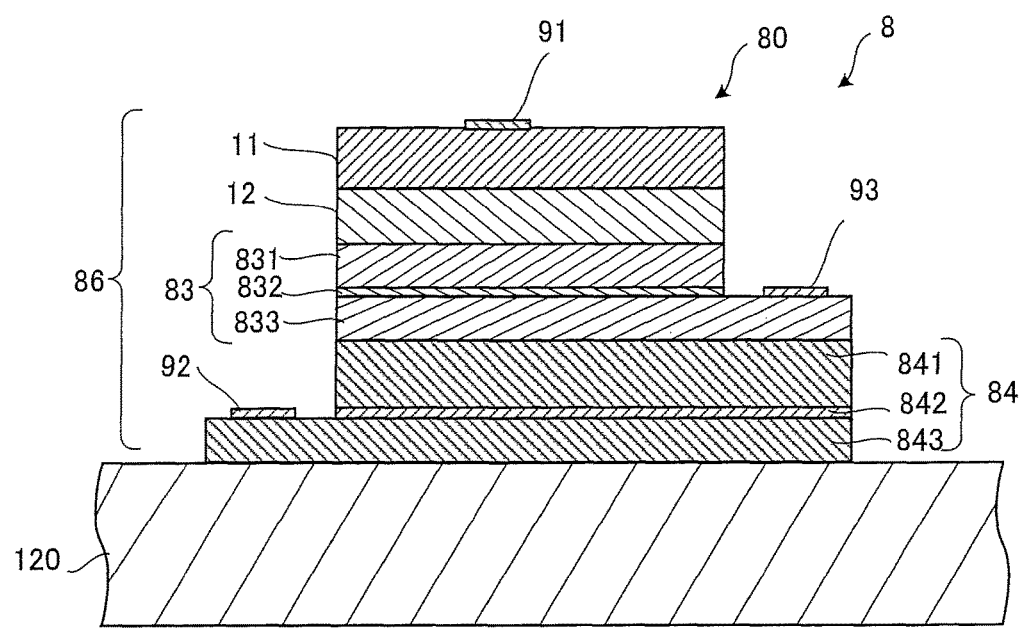
FIG. 15 is a sectional view schematically illustrating a configuration of a light emitting element device according to an eighth embodiment of the present invention.

FIG. 15 is a sectional view schematically illustrating a configuration of a light emitting element device 8 according to an eighth embodiment of the present invention. In FIG. 15, elements that are the same as or correspond to those illustrated in FIG. 12 (or the sixth embodiment) are given the same reference characters. The light emitting element device 8 according to the eighth embodiment differs from the light emitting element device 6 according to the sixth embodiment in the following three points.

Firstly, in the eighth embodiment, a fourth semiconductor layer (or n-type cathode layer) 84 of the second conductivity type, a third semiconductor layer (or p-type gate layer) 83 of the first conductivity type, the second semiconductor layer (or n-type gate layer) 12 of the second conductivity type, and the first semiconductor layer (or p-type anode layer) 11 of the first conductivity type are layered in this order on the semiconductor substrate 120.

Secondly, the third semiconductor layer (or p-type gate layer) 83 includes a third layer 833, a second layer 832 adjacent to a surface of the third layer 833 on the second semiconductor layer 12 side, and a first layer 831 adjacent to a surface of the second layer 832 on the second semiconductor layer 12 side; the second layer 832 is an etching stop layer (or first etching stop layer). For example, the third layer 833 is a p-type AlGaAs layer, the second layer 832 is a p-type InGaP layer and serves as an etching stop layer, and the first layer 831 is a p-type AlGaAs layer. The gate electrode 93 is provided on the third layer 833.

Thirdly, the fourth semiconductor layer (or n-type cathode layer) 84 includes a third layer 843, a second layer 842 adjacent to a surface of the third layer 843 on the second semiconductor layer 12 side, and a first layer 841 adjacent to a surface of the second layer 842 on the second semiconductor layer 12 side; the second layer 842 is another etching stop layer (or second etching stop layer). For example, the third layer 843 is an n-type AlGaAs layer, the second layer 842 is an n-type InGaP layer, and the first layer 841 is an n-type AlGaAs layer. The cathode electrode 92 is provided on the third layer 843.

Except for these differences, the light emitting element device 8 according to the eighth embodiment is the same as the light emitting element device 6 according to the sixth embodiment.

The light emitting element device 8 includes a light emitting thyristor portion (which may also be referred to as a light emitting element device) 80 including a light emitting thyristor 86, and a part of the semiconductor substrate 120 on which the light emitting thyristor portion 80 is provided.

<8-2> Manufacturing Process of Light Emitting Element Device

The light emitting element device 8 is produced as follows, for example. First, the light emitting thyristor 86 is formed on an n-type AlAs layer (or separation layer) on a production substrate. The light emitting thyristor 86 has a layered structure consisting of the third layer (or n-type AlGaAs layer) 843 of the n-type cathode layer (or n-type AlGaAs layer) 84, the second layer (or n-type InGaP layer) 842, which is the second etching stop layer, the first layer (or n-type AlGaAs layer) 841 of the n-type cathode layer 84, the third layer (or p-type AlGaAs layer) 833 of the p-type gate layer 83, the second layer (or p-type InGaP layer) 832, which is the first etching stop layer, the first layer (or p-type AlGaAs layer) 831 of the p-type gate layer 83, the n-type gate layer (or n-type AlGaAs layer) 12, and the p-type anode layer (or p-type AlGaAs layer) 11. The second layer 832, which is the first etching stop layer, is a semiconductor layer having an etching rate lower than that of the semiconductor layer (in FIG. 15, the first layer 831) adjacent to and above the second layer 832. In this example, the second layer 832 has an etching rate lower than that of each of the semiconductor layers (in FIG. 15, the first layer 831 and third layer 833 of the p-type gate layer 83) adjacent to the second layer 832. The second layer 842, which is the second etching stop layer, is a semiconductor layer having an etching rate lower than that of the semiconductor layer (in FIG. 15, the first layer 841) adjacent to and above the second layer 842. In this example, the second layer 842 has an etching rate lower than that of each of the semiconductor layers (in FIG. 15, the first layer 841 and third layer 843 of the n-type cathode layer 84) adjacent to the second layer 842.

Next, by wet etching, the third layer 833 of the p-type gate layer 83 is partially exposed, so that a region on which the gate electrode 93 is to be formed is formed.

Next, by wet etching, the third layer 833 of the p-type gate layer 83 and the first layer 841 of the n-type cathode layer 84 are partially etched, so that a region on which the cathode electrode 92 is to be formed is formed.

Next, the anode electrode 91 is formed on the p-type anode layer 11, the cathode electrode 92 is formed on the third layer 843 of the n-type cathode layer 84, and the gate electrode 93 is formed on the third layer 833 of the p-type gate layer 83, so that the light emitting thyristor portion 80 including the light emitting thyristor 86 is formed. The light emitting thyristor 86, which is, for example, an epitaxial film, can be separated from the production substrate and can be attached or bonded onto another substrate.

Next, the light emitting thyristor portion 80 is separated from the production substrate and bonded onto the semiconductor substrate 120.

<8-3> Advantages

As described above, in the light emitting element device 8 according to the eighth embodiment, the etching in the first etching process stops at the second layer 832, which is an etching stop layer, in the p-type gate layer 83. Thus, the thickness of the p-type gate layer 83 can be minimized. As such, it is possible to reduce the thickness of the p-type gate layer 83, thereby improving the light extraction efficiency from the light emitting element device 8 and the switching characteristics of the light emitting element device 8.

Further, in the light emitting element device 8 according to the eighth embodiment, the second layer 832, which is an etching stop layer, is a semiconductor layer formed in the p-type gate layer 83 and having the same conductivity type as the first layer 831 and third layer 833. Thus, it is possible to reduce effects of energy barrier due to a pn junction, thereby improving the switching characteristics.

Further, in the light emitting element device 8 according to the eighth embodiment, the etching in the second etching process stops at the second layer 842, which is an etching stop layer, in the n-type cathode layer 84. Thus, the thickness of the third layer 843 of the n-type cathode layer 84 can be minimized. As such, it is possible to reduce the thickness of the third layer 843 of the n-type cathode layer 84, thereby improving the light extraction efficiency from the light emitting element device 8 when back surface reflection is used (or when a light reflecting surface made of, for example, metal is disposed on a surface of the substrate 120), and improving the switching characteristics of the light emitting element device 8.

<9> Ninth Embodiment

Figure 16:
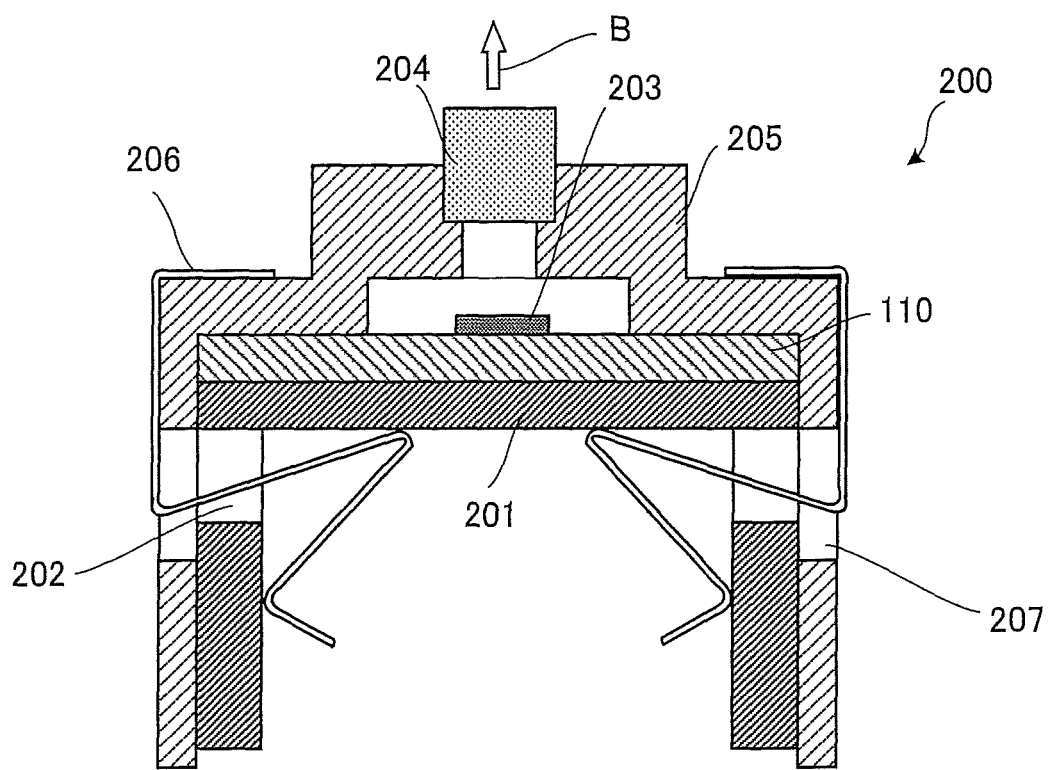
FIG. 16 is a sectional view schematically illustrating a configuration of an optical print head according to a ninth embodiment of the present invention.

FIG. 16 is a sectional view schematically illustrating a configuration of an optical print head 200 according to a ninth embodiment of the present invention. The optical print head 200 is an exposure device of an electrophotographic printer as an electrophotographic image forming apparatus. As illustrated in FIG. 16, the optical print head 200 includes a base member 201, the COB substrate 110 (also illustrated in FIG. 1), a light emitting thyristor array chip 203 (including the semiconductor substrate 120 and light emitting thyristor portions 10 illustrated in FIG. 1, for example) as a light emitting element array chip, a lens array 204 as an erecting equal magnification imaging lens, a lens holder 205, and a clamper 206. The base member 201 is a member to which the COB substrate 110 is fixed. The base member 201 has, in its sides, openings 202 through which the clamper 206 fixes the COB substrate 110 and lens holder 205 to the base member 201. The lens holder 205 is formed by, for example, injection molding of organic polymeric material or the like. The COB substrate 110 is a substrate on which the light emitting thyristor array chip 203 is mounted. The light emitting thyristor array chip 203 includes a substrate (e.g., the semiconductor substrate 120 in FIG. 1) including a drive circuit, and a light emitting thyristor array provided on the substrate (or light emitting thyristors bonded to the substrate). The lens array 204 is an optical lens group that focuses light emitted from the light emitting thyristor array (or light emitting element array) of the light emitting thyristor array chip 203 on a photosensitive drum as an image carrier to form an image. The arrow B in FIG. 16 indicates light emitted from the lens array 204. The lens holder 205 holds the lens array 204 at a predetermined position of the base member 110. The clamper 206 is a spring member that clamps and holds the base member 201, COB substrate 110, and lens holder 205 through the openings 202 in the base member 201 and openings 207 in the lens holder 205.

In the ninth embodiment, each of the light emitting element portions constituting the light emitting element array of the optical print head 200 is the light emitting element device according to any one of the first to eighth embodiments.

In the optical print head 200, the drive circuit causes the light emitting thyristor array to selectively emit light based on print data, and the lens array 204 focuses the emitted light onto a uniformly charged surface of the photosensitive drum, so that an electrostatic latent image is formed on the photosensitive drum. Then, through a development process, a transfer process, and a fixing process, an image consisting of developer is formed (or printed) on a print medium (e.g., a sheet of paper).

As described above, the optical print head 200 according to the ninth embodiment has improved efficiency of extraction of light from the light emitting element devices including the light emitting thyristors. This can reduce electric power necessary for exposure of the photosensitive drum.

<10> Modifications

In the first to eighth embodiments, the first conductivity type is p-type and the second conductivity type is n-type, but the first conductivity type may be n-type and the second conductivity type may be p-type.

In the first to eighth embodiments, the second semiconductor layer preferably has a band gap smaller than that of each of the first semiconductor layer and fourth semiconductor layer.

In the first to fifth embodiments, the etching stop layer preferably has an impurity density lower than that of the semiconductor layer adjacent to and above the etching stop layer; the etching stop layer preferably has an impurity density lower than that of the semiconductor layer adjacent to and below the etching stop layer; the etching stop layer preferably has an impurity density lower than that of each of the semiconductor layers adjacent to the etching stop layer. The phrase "above the etching stop layer" refers to being situated on the opposite side of the semiconductor substrate 120 with respect to the etching stop layer. The phrase "below the etching stop layer" refers to being situated on the semiconductor substrate 120 side of the etching stop layer. The same applies to the first etching stop layer and second etching stop layer in the sixth to eighth embodiments.

In the first to fifth embodiments, the etching stop layer preferably has a thickness in the range of 10 nm to 50 nm. The same applies to the first etching stop layer and second etching stop layer in the sixth to eighth embodiments.

The present invention is not limited to the embodiments described above; it can be practiced in various other aspects without departing from the invention scope.

What is claimed is:

1. A light emitting element device comprising:
   a light emitting thyristor having a layered structure including a first semiconductor layer of a first conductivity type, a second semiconductor layer of a second conductivity type different from the first conductivity type, a third semiconductor layer of the first conductivity type, and a fourth semiconductor layer of the second conductivity type that are layered in this order; and
   a gate electrode for supplying gate current to the light emitting thyristor,
   wherein the light emitting thyristor includes an etching stop layer disposed on a surface of the third semiconductor layer facing the fourth semiconductor layer, the etching stop layer being a semiconductor layer having an etching rate lower than an etching rate of a semiconductor layer adjacent to the etching stop layer, and
   wherein the gate electrode is disposed on the etching stop layer.

2. A light emitting element device comprising:
   a light emitting thyristor having a layered structure including a first semiconductor layer of a first conductivity type, a second semiconductor layer of a second conductivity type different from the first conductivity type, a third semiconductor layer of the first conductivity type, and a fourth semiconductor layer of the second conductivity type that are layered in this order; and
   a gate electrode for supplying gate current to the light emitting thyristor,
   wherein the light emitting thyristor includes an etching stop layer included in the third semiconductor layer, the etching stop layer being a semiconductor layer having an etching rate lower than an etching rate of a semiconductor layer adjacent to the etching stop layer, wherein the third semiconductor layer includes:
a first layer;
a second layer adjacent to a surface of the first layer on the fourth semiconductor layer side; and
a third layer adjacent to a surface of the second layer on the fourth semiconductor layer side, and
wherein the second layer of the third semiconductor layer is the etching stop layer.

3. The light emitting element device of claim 2, wherein the gate electrode is disposed on the first layer or the third layer of the third semiconductor layer.

4. The light emitting element device of claim 1, wherein the second semiconductor layer has a band gap smaller than a band gap of each of the first semiconductor layer and the fourth semiconductor layer.

5. The light emitting element device of claim 1, wherein the etching stop layer has an impurity density lower than an impurity density of a semiconductor layer adjacent to the etching stop layer.

6. The light emitting element device of claim 1, wherein the etching stop layer has a thickness in a range of 10 nm to 50 nm.

7. The light emitting element device of claim 1, wherein the etching stop layer is an InGaP layer.

8. A light emitting element device comprising:
a light emitting thyristor having a layered structure including a first semiconductor layer of a first conductivity type, a second semiconductor layer of a second conductivity type different from the first conductivity type, a third semiconductor layer of the first conductivity type, and a fourth semiconductor layer of the second conductivity type that are layered in this order; and
a gate electrode for supplying gate current to the light emitting thyristor,
wherein the light emitting thyristor includes an etching stop layer disposed on a surface of the third semiconductor layer or included in the third semiconductor layer, the etching stop layer being a semiconductor layer having an etching rate lower than an etching rate of a semiconductor layer adjacent to the etching stop layer,
wherein the first semiconductor layer includes:
a first layer;
a second layer adjacent to a surface of the first layer on the second semiconductor layer side; and
a third layer adjacent to a surface of the second layer on the second semiconductor layer side, and
wherein the second layer of the first semiconductor layer is another etching stop layer that is a semiconductor layer having an etching rate lower than an etching rate of a semiconductor layer adjacent to the second layer of the first semiconductor layer.

9. The light emitting element device of claim 2, wherein the first semiconductor layer includes:
a first layer;
a second layer adjacent to a surface of the first layer on the second semiconductor layer side; and
a third layer adjacent to a surface of the second layer on the second semiconductor layer side, and
wherein the second layer of the first semiconductor layer is another etching stop layer that is a semiconductor layer having an etching rate lower than an etching rate of a semiconductor layer adjacent to the second layer of the first semiconductor layer.

10. A light emitting element device comprising:
a light emitting thyristor having a layered structure including a first semiconductor layer of a first conductivity type, a second semiconductor layer of a second conductivity type different from the first conductivity type, a third semiconductor layer of the first conductivity type, and a fourth semiconductor layer of the second conductivity type that are layered in this order; and
a gate electrode for supplying gate current to the light emitting thyristor,
wherein the light emitting thyristor includes an etching stop layer disposed on a surface of the third semiconductor layer or included in the third semiconductor layer, the etching stop layer being a semiconductor layer having an etching rate lower than an etching rate of a semiconductor layer adjacent to the etching stop layer,
wherein the fourth semiconductor layer includes:
a first layer;
a second layer adjacent to a surface of the first layer on the third semiconductor layer side; and
a third layer adjacent to a surface of the second layer on the third semiconductor layer side, and
wherein the second layer of the fourth semiconductor layer is another etching stop layer that is a semiconductor layer having an etching rate lower than an etching rate of a semiconductor layer adjacent to the second layer of the fourth semiconductor layer.

11. The light emitting element device of claim 2, wherein the fourth semiconductor layer includes:
a first layer;
a second layer adjacent to a surface of the first layer on the third semiconductor layer side; and
a third layer adjacent to a surface of the second layer on the third semiconductor layer side, and
wherein the second layer of the fourth semiconductor layer is another etching stop layer that is a semiconductor layer having an etching rate lower than an etching rate of a semiconductor layer adjacent to the second layer of the fourth semiconductor layer.

12. The light emitting element device of claim 1, further comprising:
a first electrode electrically connected to the first semiconductor layer; and
a second electrode electrically connected to the fourth semiconductor layer.

13. The light emitting element device of claim 1, further comprising a substrate provided with a drive circuit,
wherein the light emitting thyristor is bonded onto the substrate.

14. An optical print head comprising:
a light emitting element array including a plurality of light emitting element portions; and
a lens array that focuses light emitted from the light emitting element array,
wherein each of the plurality of light emitting element portions is the light emitting element device of claim 1.

15. The light emitting element device of claim 1, wherein the third semiconductor layer is an AlGaAs layer, and the etching stop layer is an InGaP layer.

* * * * *